United States Patent
Hirakawa et al.

(10) Patent No.: US 9,827,756 B2
(45) Date of Patent: Nov. 28, 2017

(54) SEPARATION APPARATUS, SEPARATION SYSTEM, AND SEPARATION METHOD

(75) Inventors: Osamu Hirakawa, Koshi (JP); Masaru Honda, Koshi (JP); Xavier Francois Brun, Chandler, AZ (US); Charles Wayne Singleton, Jr., Chandler, AZ (US)

(73) Assignees: TOKYO ELECTRON LIMITED, Tokyo (JP); Intel Corporation, Santa Clara, CA (US)

( * ) Notice: Subject to any disclaimer, the term of this patent is extended or adjusted under 35 U.S.C. 154(b) by 0 days.

(21) Appl. No.: 14/009,850

(22) PCT Filed: Mar. 16, 2012

(86) PCT No.: PCT/JP2012/056864
§ 371 (c)(1),
(2), (4) Date: Oct. 4, 2013

(87) PCT Pub. No.: WO2012/140987
PCT Pub. Date: Oct. 18, 2012

(65) Prior Publication Data
US 2014/0020846 A1    Jan. 23, 2014

(30) Foreign Application Priority Data
Apr. 12, 2011 (JP) .................... 2011-087915

(51) Int. Cl.
*B32B 38/10* (2006.01)
*H01L 21/67* (2006.01)
(Continued)

(52) U.S. Cl.
CPC ............ *B32B 38/10* (2013.01); *B32B 43/006* (2013.01); *H01L 21/6715* (2013.01);
(Continued)

(58) Field of Classification Search
CPC . B32B 38/10; B32B 43/006; Y10T 156/1137; Y10T 156/1189; Y10T 156/1939; Y10T 156/1972
See application file for complete search history.

(56) References Cited

U.S. PATENT DOCUMENTS 8,343,300 B2 * 1/2013 Hermanowski ............... 156/281
2003/0102682 A1 * 6/2003 Kurokawa ................... 294/64.1
(Continued)

FOREIGN PATENT DOCUMENTS

JP    09-167724 A    6/1997
JP    2004-063645 A    2/2004
(Continued)

OTHER PUBLICATIONS

International Search Report of the International Searching Authority mailed Apr. 17, 2012 for the corresponding international application No. PCT/JP2012/056864 (with English translation).

*Primary Examiner* — Mark A Osele
*Assistant Examiner* — Nickolas Harm
(74) *Attorney, Agent, or Firm* — Posz Law Group, PLC

(57) ABSTRACT

A separation apparatus for separating a superposed substrate in which a processing target substrate and a supporting substrate are joined together with an adhesive, into the processing target substrate and the supporting substrate includes: a first holding unit that includes a heating mechanism heating the processing target substrate and holds the processing target substrate; a second holding unit that includes a heating mechanism heating the supporting substrate and holds the supporting substrate; a moving mechanism that relatively moves at least the first holding unit or the second holding unit in a horizontal direction; and a porous part that is annularly provided along an outer peripheral portion of the first holding unit and formed with a
(Continued)

plurality of pores, and supplies an inert gas to the outer peripheral portion of the first holding unit holding the processing target substrate.

24 Claims, 22 Drawing Sheets

(51) Int. Cl.
    *H01L 21/677*     (2006.01)
    *B32B 43/00*     (2006.01)

(52) U.S. Cl.
    CPC .. *H01L 21/67092* (2013.01); *H01L 21/67109* (2013.01); *H01L 21/67748* (2013.01); *B32B 2457/14* (2013.01); *Y10T 156/1137* (2015.01); *Y10T 156/1153* (2015.01); *Y10T 156/1189* (2015.01); *Y10T 156/1911* (2015.01); *Y10T 156/1939* (2015.01); *Y10T 156/1972* (2015.01)

(56) References Cited

U.S. PATENT DOCUMENTS

| | | | |
|---|---|---|---|
| 2005/0074952 A1* | 4/2005 | Miyamoto et al. | 438/455 |
| 2007/0128570 A1* | 6/2007 | Goto et al. | 432/253 |
| 2007/0194005 A1* | 8/2007 | Hirakawa et al. | 219/403 |
| 2010/0104402 A1* | 4/2010 | Nishimoto et al. | 414/160 |
| 2010/0206479 A1* | 8/2010 | Pillalamarri et al. | 156/344 |
| 2010/0323469 A1* | 12/2010 | Borthakur et al. | 438/65 |
| 2011/0048630 A1* | 3/2011 | Hase et al. | 156/272.2 |
| 2012/0000613 A1* | 1/2012 | Thallner | 156/703 |
| 2012/0080150 A1* | 4/2012 | Riege et al. | 156/752 |

FOREIGN PATENT DOCUMENTS

| | | |
|---|---|---|
| JP | 2006-328151 A | 12/2006 |
| JP | 2008-277552 A | 11/2008 |
| JP | 2009-289878 A | 12/2009 |
| JP | 2010-010207 A | 1/2010 |

* cited by examiner

SEPARATION APPARATUS, SEPARATION SYSTEM, AND SEPARATION METHOD

TECHNICAL FIELD

The present invention relates to a separation apparatus for separating a superposed substrate into a processing target substrate and a supporting substrate, a separation system including the separation apparatus, and a separation method using the separation apparatus.

BACKGROUND ART

In recent years, for example, in a manufacturing process of a semiconductor device, the diameter of a semiconductor wafer (hereinafter, referred to as a "wafer") increasingly becomes larger. Further, the wafer is required to be thinner in a specific process such as mounting. When a thin wafer with a large diameter is transferred or subjected to polishing as it is, warpage or break can occur in the wafer. Therefore, in order to reinforce the wafer, for example, bonding the wafer to a wafer being a supporting substrate or a glass substrate is performed. The predetermined processing such as polishing and the like are performed on the wafer with the wafer being joined with the supporting substrate as described above, and then the wafer and the supporting substrate are separated from each other.

The separation of the wafer and the supporting substrate from each other is performed using, for example, a separation apparatus. For example, Patent Document 1 proposes a separation apparatus that directly joins a wafer having devices formed thereon to a supporting substrate having a thermally oxidized film formed thereon and then separates the wafer. The separation apparatus has, for example, a first holder that holds the wafer, a second holder that holds the supporting substrate, and a nozzle that jets liquid between the wafer and the supporting substrate. Then, this separation apparatus separates the wafer and the supporting substrate from each other by jetting liquid from the nozzle to between the wafer and supporting substrate joined together, namely, to a joint surface between the wafer and supporting substrate, at a jetting pressure greater than the joint strength between the wafer and the supporting substrate, preferably, a jetting pressure twice or greater than the joint strength.

[Patent Document 1] Japanese Laid-open Patent Publication No. H9-167724

DISCLOSURE OF THE INVENTION

Problems to be Solved by the Invention

Incidentally, for joining the wafer and the supporting substrate, there are methods of joining the wafer and the supporting substrate with an adhesive intervening between them, in addition to the method of directly joining the wafer to the supporting substrate having the thermally oxidized film formed thereon as disclosed, for example, in Paten Document 1.

In the case where the joint is performed using an adhesive, the adhesive intervening between the wafer and the supporting substrate needs to be softened for separating the wafer and the supporting substrate from each other. Therefore, at the time to separate the wafer and the supporting substrate from each other, heat treatment is performed on the wafer and the supporting substrate in the joined state in order to soften the adhesive.

However, if the wafer has been subjected to the heat treatment, oxidation of an exposed surface of the wafer, namely, exposed devices on the wafer proceeds. Then, the oxidation may seriously damage products.

Here, along with higher performance of recent semiconductor devices, devices in a predetermined pattern are sometimes formed on both surfaces of a wafer. More specifically, device are formed not only on a joint surface of the wafer that is to be joined to a supporting substrate but also on a non-joint surface of the wafer that is opposite to the joint surface and supported by a first holder. In this case, a gap is generated between a holding surface of the first holder and the non-joint surface of the wafer due to projections and depressions of the devices to cause a part of the non-joint surface of the wafer to be exposed. Thus, when the first holder suction-holds the wafer, surrounding air flows thereinto through the gap. This oxidizes the exposed non-joint surface in the heated wafer as described above.

The present invention has been made in consideration of the above point, and an object thereof is to suppress oxidation of a non-joint surface of a processing target substrate during separation processing of the processing target substrate and a supporting substrate involving heat treatment.

Means for Solving the Problems

To achieve the above object, the present invention is a separation apparatus for separating a superposed substrate in which a processing target substrate and a supporting substrate are joined together with an adhesive, into the processing target substrate and the supporting substrate, the separation apparatus including: a first holding unit that includes a heating mechanism heating the processing target substrate and holds the processing target substrate; a second holding unit that includes a heating mechanism heating the supporting substrate and holds the supporting substrate; a moving mechanism that relatively moves at least the first holding unit or the second holding unit in a horizontal direction; and a porous part that is annularly provided along an outer peripheral portion of the first holding unit and formed with a plurality of pores, and supplies an inert gas to the outer peripheral portion of the first holding unit holding the processing target substrate.

According to the present invention, it is possible to relatively move the first holding unit and the second holding unit in the horizontal direction by the moving mechanism while heating the processing target substrate held by the first holding unit and the supporting substrate held by the second holding unit, to separate the processing target substrate and the supporting substrate from each other. It is also possible that when the first holding unit holds the processing target substrate, the inert gas is supplied to the outer peripheral portion of the first holding unit from the porous part. In this event, the inert gas is supplied from the porous part formed with the plurality of pores, so that the flow rate of the inert gas is suppressed. Thus, when supplying the inert gas, only the inert gas is supplied to the outer peripheral portion of the first holding unit without involving the surrounding air thereinto. Therefore, for example, even when devices are formed on the non-joint surface of the processing target substrate held by the first holding unit, namely, even when a gap is generated between the holding surface of the first holding unit and the non-joint surface of the processing target substrate, only the inert gas supplied from the porous part flows into the gap. Therefore, according to the present invention, the oxidation of the non-joint surface of the processing target substrate which has been subjected to heat treatment can be suppressed.

The present invention according to another aspect is a separation system including a separation apparatus for separating a superposed substrate in which a processing target substrate and a supporting substrate are joined together with an adhesive, into the processing target substrate and the supporting substrate, the separation apparatus including: a first holding unit that includes a heating mechanism heating the processing target substrate and holds the processing target substrate; a second holding unit that includes a heating mechanism heating the supporting substrate and holds the supporting substrate; a moving mechanism that relatively moves at least the first holding unit or the second holding unit in a horizontal direction; and a porous part that is annularly provided along an outer peripheral portion of the first holding unit and formed with a plurality of pores, and supplies an inert gas to the outer peripheral portion of the first holding unit holding the processing target substrate, the separation system including a transfer apparatus that transfers the processing target substrate separated in the separation apparatus, wherein the transfer apparatus has a Bernoulli chuck that jets an inert gas to hold the processing target substrate.

The present invention according to still another aspect is a separation method of separating a superposed substrate in which a processing target substrate and a supporting substrate are joined together with an adhesive, into the processing target substrate and the supporting substrate using a separation apparatus, the separation apparatus including: a first holding unit that includes a heating mechanism heating the processing target substrate and holds the processing target substrate; a second holding unit that includes a heating mechanism heating the supporting substrate and holds the supporting substrate; a moving mechanism that relatively moves at least the first holding unit or the second holding unit in a horizontal direction; and a porous part that is annularly provided along an outer peripheral portion of the first holding unit and formed with a plurality of pores, and supplies an inert gas to the outer peripheral portion of the first holding unit holding the processing target substrate, the separation method including relatively moving the first holding unit and the second holding unit in the horizontal direction by the moving mechanism while heating the processing target substrate held by the first holding unit and the supporting substrate held by the second holding unit, to separate the processing target substrate and the supporting substrate from each other, wherein when the first holding unit holds the processing target substrate, the inert gas is supplied to the outer peripheral portion of the first holding unit from the porous part.

Effect of the Invention

According to the present invention, it is possible to suppress oxidation of a non-joint surface of a processing target substrate during separation processing of the processing target substrate and a supporting substrate involving heat treatment.

BEST MODE FOR CARRYING OUT THE INVENTION

Figure 1:
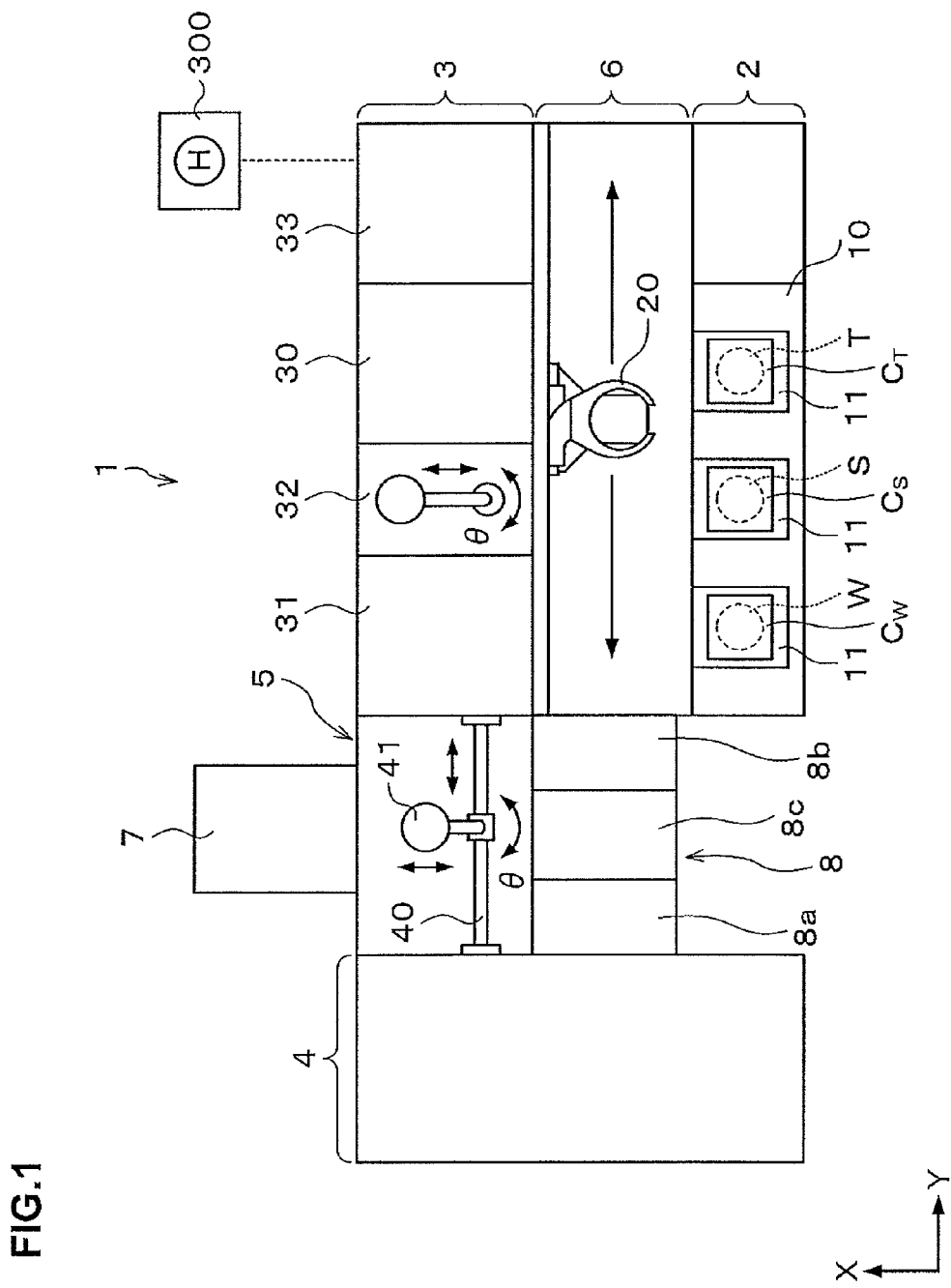
FIG. 1 A plan view illustrating the outline of a configuration of a separation system according to an embodiment.

Hereinafter, embodiments of the present invention will be described. FIG. 1 is a plan view illustrating the outline of a configuration of a separation system 1 according to an embodiment.

Figure 2:
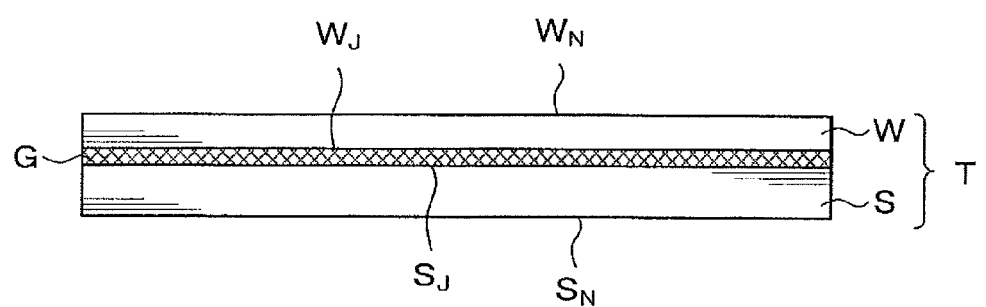
FIG. 2 A side view of a processing target wafer and a supporting wafer.

In the separation system 1, a superposed wafer T as a superposed substrate in which a processing target wafer W as a processing target substrate and a supporting wafer S as a supporting substrate are joined together with an adhesive G as illustrated in FIG. 2 is separated into the processing target wafer W and the supporting wafer S. Hereinafter, in the processing target wafer W, the surface to be joined with the supporting wafer S via the adhesive G is referred to as a "joint surface $W_J$" and the surface opposite to the joint surface $W_J$ is referred to as "a non-joint surface $W_N$." Similarly, in the supporting wafer S, the surface to be joined with the processing target wafer W via the adhesive G is referred to as a "joint surface $S_J$" and the surface opposite to the joint surface $S_J$ is referred to as "a non-joint surface $S_N$." Note that the processing target wafer W is a wafer which will be a product, and a plurality of devices have been formed, for example, on the joint surface $W_J$ and the non-joint surface $W_N$. Further, in the processing target wafer W, for example, the non-joint surface $W_N$ has been subjected to polishing to be thinned (for example, with a thickness of 50 µm). The supporting wafer S is a wafer which has the same diameter as that of the processing target wafer W and supports the processing target wafer W. Note that a case of using a wafer as the supporting substrate will be described in this embodiment, but other substrates such as, for example, a glass substrate and the like may be used.

The separation system 1 has, as illustrates in FIG. 1, a configuration in which a transfer-in/out station 2 into/from which cassettes $C_W$, $C_S$, $C_T$ capable of housing a plurality of processing target wafers W, a plurality of supporting wafers S, and a plurality of superposed wafers T respectively are transferred from/to the outside, a separation processing station 3 including various processing and treatment apparatuses that perform predetermined processing and treatment on the processing target wafer W, the supporting wafer S, and the superposed wafer T, and an interface station 5 that delivers the processing target wafer W to/from a post-processing station 4 adjacent to the separation processing station 3, are integrally connected.

The transfer-in/out station 2 and the separation processing station 3 are arranged side by side in an X-direction (a top-bottom direction in FIG. 1). Between the transfer-in/out station 2 and the separation processing station 3, a wafer transfer region 6 is formed. The interface station 5 is located on a Y-direction negative direction side (a left direction side in FIG. 1) of the separation processing station 3. On an X-direction positive direction side (an upper direction side in FIG. 1) of the interface station 5, an inspection apparatus 7 that inspects the processing target wafer W before being delivered to the post-processing station 4 is disposed. Further, on the side opposite to the inspection apparatus 7 across the interface station 5, namely, on an X-direction negative direction side (a lower direction side in FIG. 1) of the interface station 5, a post-inspection cleaning apparatus 8 that cleans the processing target wafer W after inspection is disposed.

In the transfer-in/out station 2, a cassette mounting table 10 is provided. On the cassette mounting table 10, a plurality of, for example, three cassette mounting plates 11 are provided. The cassette mounting plates 11 are arranged side by side in a line in a Y-direction (a right-left direction in FIG. 1). On these cassette mounting plates 11, the cassettes $C_W$, $C_S$, $C_T$ can be mounted when the cassettes $C_W$, $C_S$, $C_T$ are transferred in/out from/to the outside of the separation system 1. As described above, the transfer-in/out station 2 is configured to be capable of holding the plurality of processing target wafers W, the plurality of supporting wafers S, and the plurality of superposed wafers T. Note that the number of cassette mounting plates 11 is not limited to this embodiment but can be arbitrarily determined. Further, the plurality of superposed wafers T transferred into the transfer-in/out station 2 have been subjected to inspection in advance and discriminated between a superposed wafer T including a normal processing target wafer W and a superposed wafer T including a defective processing target wafer W.

In the wafer transfer region 6, a first transfer apparatus 20 is disposed. The first transfer apparatus 20 has, for example, a transfer arm that is movable, for example, in the vertical direction, the horizontal directions (the X-direction, the Y-direction), and around the vertical axis. The first transfer apparatus 20 can move in the wafer transfer region 6 and transfer the processing target wafer W, the supporting wafer S, the superposed wafer T between the transfer-in/out station 2 and the separation processing station 3.

The separation processing station 3 has a separation apparatus 30 that separates the superposed wafer T into the processing target wafer W and the supporting wafer S. On the Y-direction negative direction side (the left direction side in FIG. 1) of the separation apparatus 30, a first cleaning apparatus 31 that cleans the separated processing target wafer W is disposed. Between the separation apparatus 30 and the first cleaning apparatus 31, a second transfer apparatus 32 is provided. Further, on the Y-direction positive direction side (the right direction side in FIG. 1) of the separation apparatus 30, a second cleaning apparatus 33 that cleans the separated supporting wafer S is disposed. As described above, in the separation processing station 3, the first cleaning apparatus 31, the second transfer apparatus 32, the separation apparatus 30, and the second cleaning apparatus 33 are arranged side by side in this order from the interface station 5 side.

The inspection apparatus 7 inspects the presence or absence of a residue of the adhesive G on the processing target wafer W separated by the separation apparatus 30. Further, the post-inspection cleaning apparatus 8 cleans the processing target wafer W for which the residue of the adhesive G has been confirmed in the inspection apparatus 7. The post-inspection cleaning apparatus 8 has a joint surface cleaning unit 8a that cleans the joint surface $W_J$ of the processing target wafer W, a non-joint surface cleaning unit 8b that cleans the non-joint surface $W_N$ of the processing target wafer W, and a reversing unit 8c that vertically reverses the processing target wafer W.

In the interface station 5, a third transfer apparatus 41 which is movable on a transfer path 40 that extends in the Y-direction is provided. The third transfer apparatus 41 is also movable in the vertical direction and around the vertical axis (in a O-direction), and thus can transfer the processing target wafer W between the separation processing station 3, the post-processing station 4, the inspection apparatus 7, and the post-inspection cleaning apparatus 8.

Note that in the post-processing station 4, predetermined post-processing is performed on the processing target wafer W separated in the separation processing station 3. As the predetermined post-processing, for example, processing of mounting the processing target wafer W, processing of performing inspection of electric characteristics of the devices on the processing target wafer W, processing of dicing the processing target wafer W into chips are performed.

Figure 3:
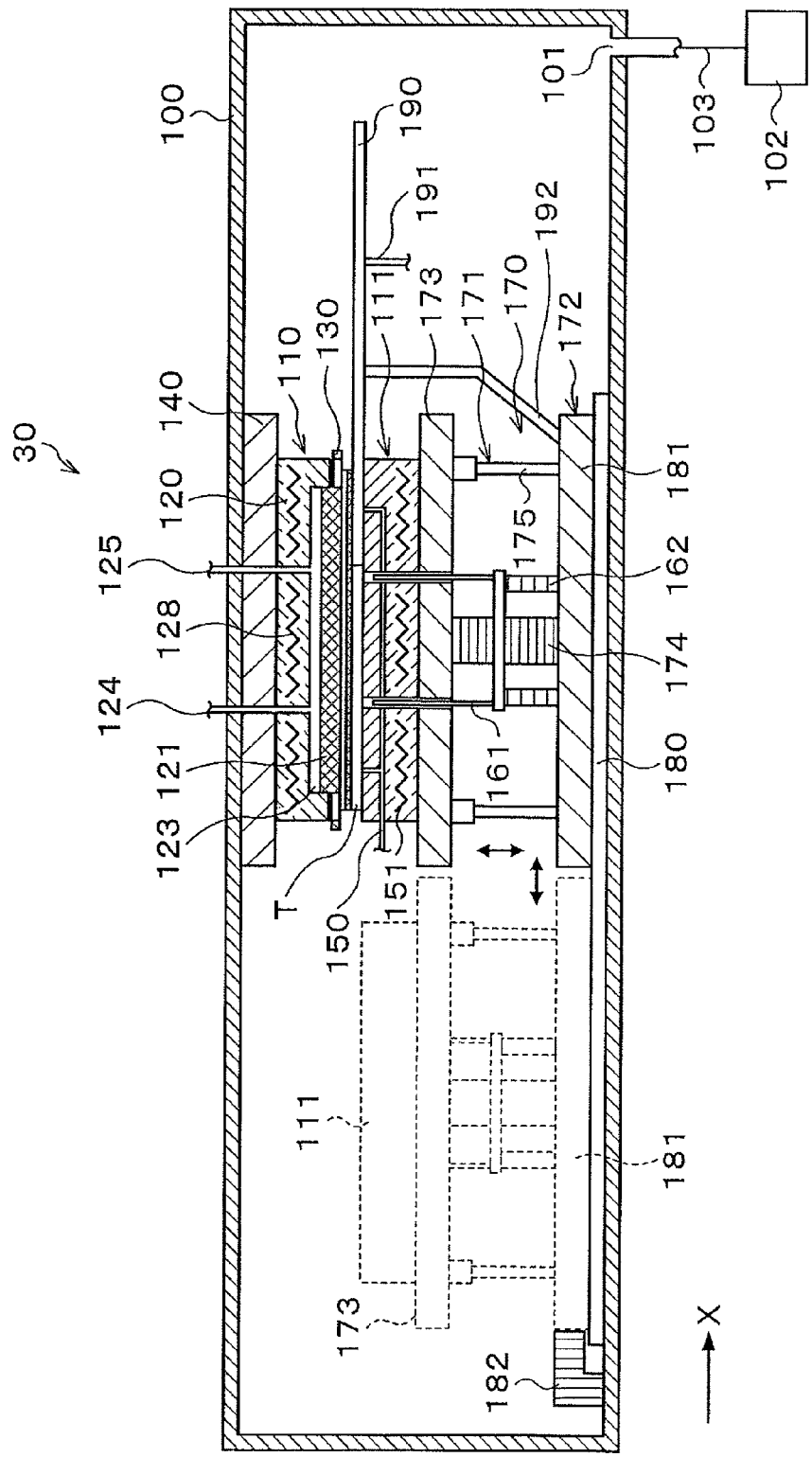
FIG. 3 A longitudinal sectional view illustrating the outline of a configuration of a separation apparatus.

Next, the configuration of the above-described separation apparatus 30 will be described. The separation apparatus 30 has a processing container 100 that houses a plurality of instruments therein as illustrated in FIG. 3. In the side surface of the processing container 100, a transfer-in/out port (not illustrated) for the processing target wafer W, the supporting wafer S, and the superposed wafer T is formed, and an opening/closing shutter (not illustrated) is provided at the transfer-in/out port. Note that the processing container 100 in this embodiment is constituted of a thin plate of, for example, stainless steel or the like and does not seal the inside thereof. The structure of the processing container 100 is not limited to this embodiment but may be, for example, an airtight container capable of hermetically closing the inside thereof.

At the bottom surface of the processing container 100, an exhaust port 101 exhausting the atmosphere in the processing container 100 is formed. An exhaust pipe 103 communicating with an exhaust apparatus 102 such as, for example, a vacuum pump is connected to the exhaust port 101.

Figure 4:
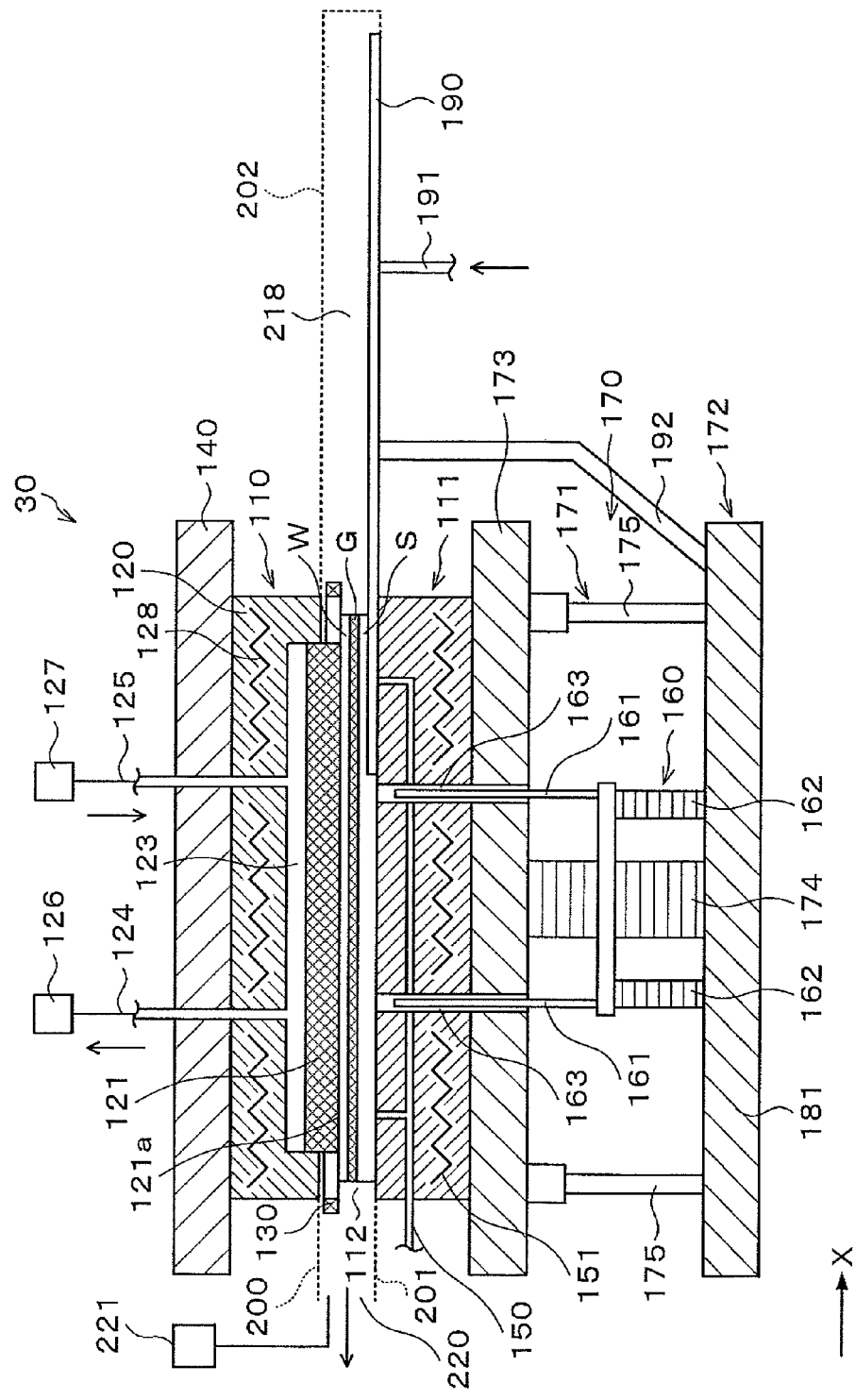
FIG. 4 A longitudinal sectional view illustrating the outline of an internal configuration of the separation apparatus.

Inside the processing container 100, a first holding unit 110 that suction-holds the processing target wafer W by its lower surface, and a second holding unit 111 that mounts and holds the supporting wafer S on its upper surface are provided. As illustrated in FIG. 4, the first holding unit 110 is provided above the second holding unit 111 and disposed to face the second holding unit 111. In other words, inside the processing container 100, the separation processing is performed on the superposed wafer T with the processing target wafer W arranged on the upper side and the supporting wafer S arranged on the lower side. Further, a processing space 112 in which the separation processing is performed on the superposed wafer T is formed between the first holding unit 110 and the second holding unit 111.

For the first holding unit 110, for example, a porous chuck is used. The first holding unit 110 has a main body part 120 in a flat plate shape. On the lower surface side of the main body part 120, a porous 121 being a porous body formed with a plurality of fine pores is provided. The porous 121 comes into contact with, for example, the non-joint surface $W_N$ of the processing target wafer W to suction-hold the processing target wafer W. Further, the diameter of a holding surface 121a of the porous 121 that holds the processing target wafer W is smaller than the diameter of the processing target wafer W. Note that as the porous 121, for example, silicon carbide is used.

Figure 5:
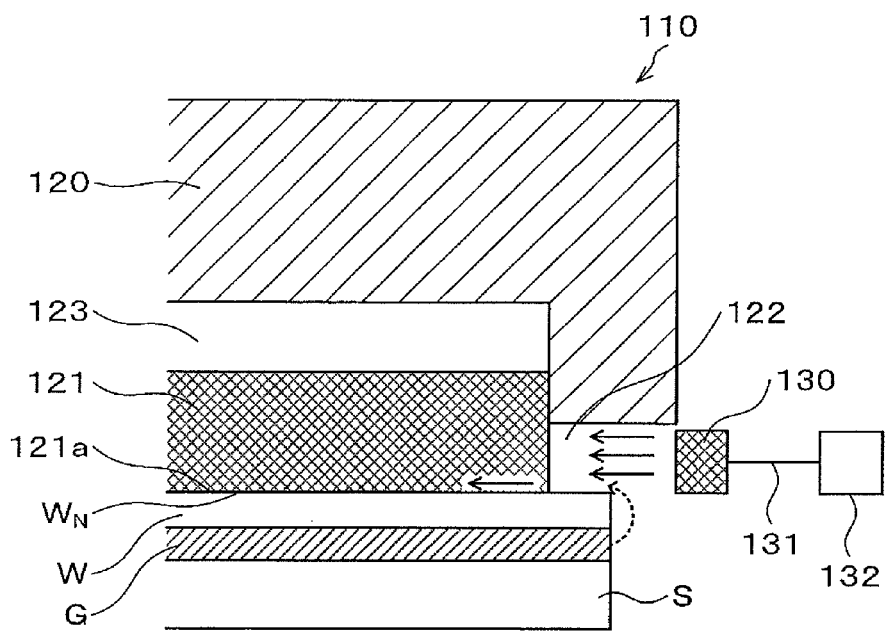
FIG. 5 A longitudinal sectional view illustrating the outline of configurations of the outer peripheral portion of a first holding unit and a porous ring.

Here, the reason why the diameter of the holding surface 121a of the porous 121 is smaller than the diameter of the processing target wafer W will be described. As will be described later, when the processing target wafer W and the supporting wafer S joined together with the adhesive G are separated from each other, the superposed wafer T is heated for softening the adhesive G. In this case, the softened adhesive G as illustrated in FIG. 5 flows around to the non-joint surface $W_N$ at the edge portion of the processing target wafer W (an arrow with a broken line in FIG. 5). Hence, to prevent the adhesive G from adhering to the porous 121 and the processing target wafer W to fix the processing target wafer W to the porous 121, the diameter of the holding surface 121a of the porous 121 is made smaller than the diameter of the processing target wafer W. In addition, between the outer peripheral portion of the main body part 120 of the first holding unit 110 and the outer peripheral portion of the processing target wafer W, a groove part 122 is formed correspondingly to the setback arrangement of the porous 121.

Further, as illustrated in FIG. 4, a flow space 123 for gas is formed inside the main body part 120 and above the porous 121. The flow space 123 is formed, for example, in a manner to cover the porous 121. To the flow space 123, a suction pipe 124 and a gas supply pipe 125 are connected. The suction pipe 124 is connected to a negative pressure generating apparatus 126 such as, for example, a vacuum pump. Then, the non-joint surface $W_N$ of the processing target wafer W is sucked from the suction pipe 124 via the flow space 123 and the porous 121 so that the processing target wafer W is suction-held by the first holding unit 110. The gas supply pipe 125 is connected to an inert gas supply source 127 that supplies, for example, a nitrogen gas as an inert gas. The inert gas is supplied from the gas supply pipe 125 to the processing space 112 via the flow space 123 and the porous 121. In this event, the inert gas is evenly supplied from the entire surface of the porous 121 because the porous 121 is formed with the plurality of pores. Note that the suction of the processing target wafer W from the suction pipe 124 and the supply of the inert gas from the gas supply pipe 125 are switched over at later-described predetermined timing. Note that the inert gas is not limited to the nitrogen gas in this embodiment but may be any gas as long as it contains no oxygen atom.

Further, inside the main body part 120 and above the flow space 123, a heating mechanism 128 that heats the processing target wafer W is provided. For the heating mechanism 128, for example, a heater is used.

Figure 6:
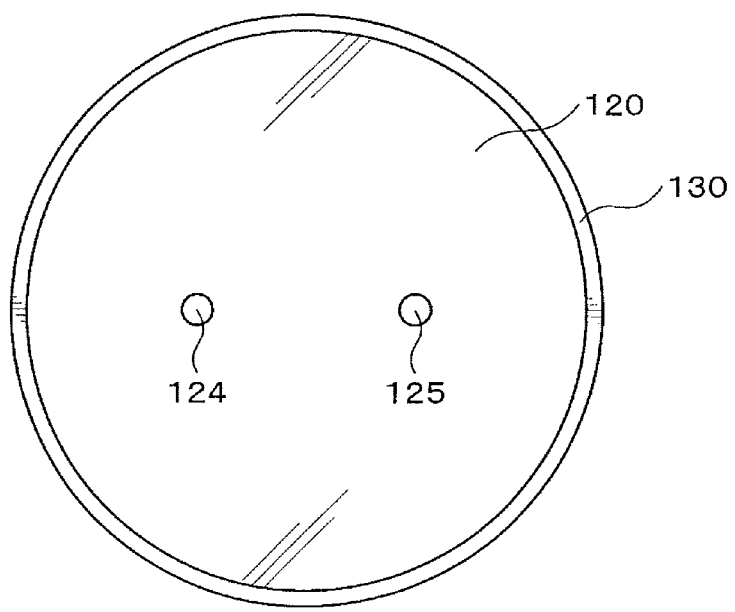
FIG. 6 A plan view illustrating the outline of configurations of the first holding unit and the porous ring.

At the outer peripheral portion of the first holding unit 110, a porous ring 130 is provided as a porous part formed with a plurality of fine pores. The porous ring 130 is annularly provided along the outer peripheral portion of the first holding unit 110 as illustrated in FIG. 6. Further, the porous ring 130 is arranged to face the groove part 122 as illustrated in FIG. 5. An inert gas supply source 132 that supplies, for example, a nitrogen gas, as an insert gas is connected to the porous ring 130 via a gas supply pipe 131. The porous ring 130 can horizontally supply the inert gas to the outer peripheral portion of the first holding unit 110, namely, the groove part 122. Note that as the porous ring 130, for example, silicon carbide is used. Further, the inert gas is not limited to the nitrogen gas in this embodiment but may be any gas as long as it contains no oxygen atom.

On the upper surface of the first holding unit 110, a supporting plate 140 that supports the first holding unit 110 is provided as illustrated in FIG. 3. The supporting plate 140 is supported on the ceiling surface of the processing container 100. Note that the supporting plate 140 in this embodiment may be omitted so that the first holding unit 110 is supported in contact with the ceiling surface of the processing container 100.

Inside the second holding unit 111, a suction pipe 150 to suction-hold the supporting wafer S is provided as illustrated in FIG. 4. The suction pipe 150 is connected to a negative pressure generating apparatus (not illustrated) such as, for example, a vacuum pump.

Further, inside the second holding unit 111, a heating mechanism 151 that heats the supporting wafer S is provided. For the heating mechanism 151, for example, a heater is used.

Below the second holding unit 111, a raising and lowering mechanism 160 that raises and lowers the superposed wafer T (or the supporting wafer S) in the processing space 112 is provided. The raising and lowering mechanism 160 has, for example, three raising and lowering pins 161 to raise and lower the superposed wafer T while supporting it from below. The raising and lowering pins 161 can move up and down by means of a driving unit 162. The driving unit 162 has, for example, a ball screw (not illustrated) and a motor (not illustrated) that turns the ball screw. Further, near the central portion of the second holding unit 111, through holes 163 penetrating the second holding unit 111 and a later-described supporting plate 173 are formed, for example, at three locations. The raising and lowering pins 161 can be inserted into the through holes 163 to project from the upper surface of the second holding unit 111.

Below the second holding unit 111, a moving mechanism 170 that moves the second holding unit 111 and the supporting wafer S in the vertical direction and the horizontal direction is provided. The moving mechanism 170 has a vertical moving unit 171 that moves the second holding unit 111 in the vertical direction and a horizontal moving unit 172 that moves the second holding unit 111 in the horizontal direction.

The vertical moving unit 171 has a supporting plate 173 that supports the lower surface of the second holding unit 111, a driving unit 174 that raises and lowers the supporting plate 173, and supporting members 175 that support the supporting plate 173. The driving unit 174 has, for example, a ball screw (not illustrated) and a motor (not illustrated) that turns the ball screw. Further, the supporting members 175 are configure to be capable of expansion and contraction in the vertical direction, and provided, for example, at three locations between the supporting plate 173 and a later-described supporting body 181.

The horizontal moving unit 172 has, as illustrated in FIG. 3, a rail 180 that extends along an X-direction (a right-left direction in FIG. 3), the supporting body 181 attached to the rail 180, and a driving unit 182 that moves the supporting body 181 along the rail 180. The driving unit 182 has, for example, a ball screw (not illustrated) and a motor (not illustrated) that turns the ball screw.

On an X-direction positive direction side (a right side in FIG. 3) of the second holding unit 111, a porous plate 190 is provided as a porous plate formed with a plurality of fine pores. To the porous plate 190, a gas supply pipe 191 is connected which supplies an inert gas to the porous plate 190. Further, the porous plate 190 is supported by the supporting body 181 of the horizontal moving unit 172 via a supporting member 192 so that the porous plate 190 can be moved in the horizontal direction by moving the horizontal moving unit 172. In other words, the porous plate 190 moves in the horizontal direction in synchronization with the second holding unit 111. Further, the porous plate 190 can supply the inert gas to the joint surface $W_J$ of the processing target wafer W exposed by moving the second holding unit 111 in the horizontal direction by the horizontal moving unit 172. Note that as the porous plate 190, for example, silicon carbide is used.

Figure 7:
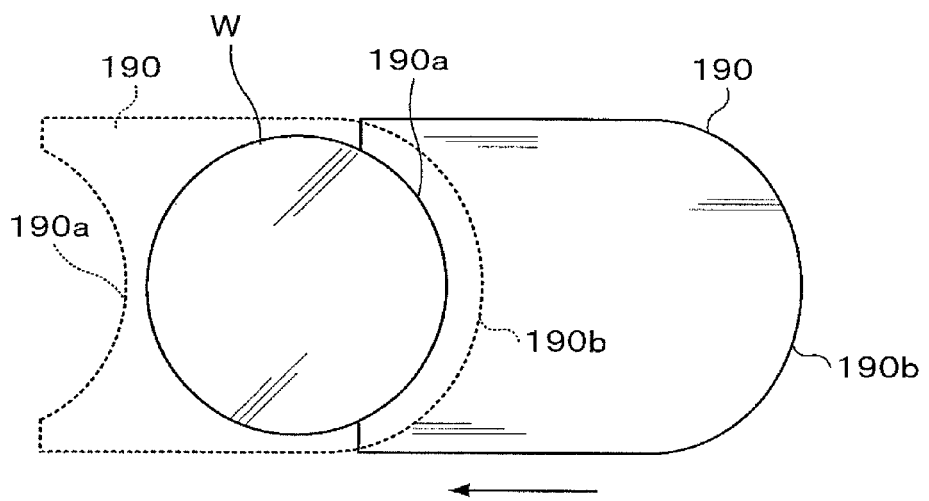
FIG. 7 A plan view illustrating the outline of a configuration of a porous plate.

The porous plate 190 has a flat plate shape capable of covering the processing target wafer W in a plan view as illustrated in FIG. 7. Further, at an end portion in the moving direction of the porous plate 190 when the porous plate 190 is moved by the horizontal moving unit 172, a hollow portion 190*a* is formed which is hollowed in a recess shape along the shape of the processing target wafer W in a plan view. More specifically, as illustrated in FIG. 7, the end portion in the moving direction of the porous plate 190 is hollowed in a semicircular shape with a diameter substantially the same as that of the processing target wafer W, and the portion of the porous plate 190 other than the hollow portion 190*a* has a size capable of covering the processing target wafer W. Further, in the porous plate 190, an end portion 190*b* opposite the end portion where the hollow portion 190*a* is formed, has a shape projecting in a semicircular shape with a diameter larger than that of the processing target wafer W. Accordingly, the porous plate 190 has a minimum size for covering the processing target wafer W. Note that the size of the porous plate 190 is not limited to this embodiment but can be arbitrarily set.

The porous plate 190 is provided in parallel with the joint surface $W_J$ of the processing target wafer W as illustrated in FIG. 3 and FIG. 4. Further, the porous plate 190 is arranged in a manner that the hollow portion 190*a* thereof is in contact with the outer peripheral portion of the processing target wafer W in a plan view as illustrated in FIG. 7 in a state that the first holding unit 110 and the second holding unit 111 face each other, namely, in a state that the processing target wafer W and the supporting wafer S are joined together.

The arrangement in the vertical direction of the porous plate 190 is adjusted so that the porous plate 190 is located below the joint surface $W_J$ of the processing target wafer W. In other words, the porous plate 190 is distanced from the joint surface $W_J$ of the processing target wafer W by a predetermined distance in the vertical direction. Note that the predetermined distance is set to 2 mm in this embodiment.

Figure 8:
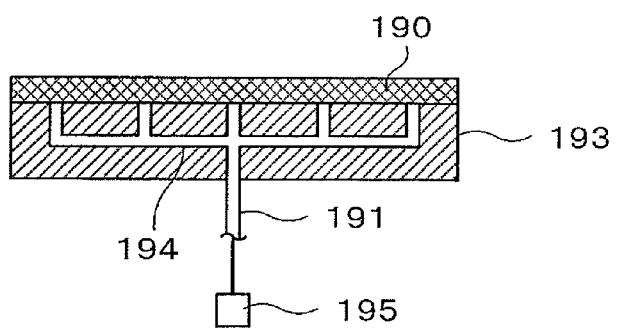
FIG. 8 A longitudinal sectional view illustrating the outline of a configuration of a mechanism that supplies an inert gas to the porous plate.

On the lower surface of the porous plate 190, a distribution plate 193 in a flat plate shape is provided in a manner to cover the porous plate 190 as illustrated in FIG. 8. As the distribution plate 193, for example, a plate made of metal such as aluminum, stainless steel is used. Inside the distribution plate 193, a gas flow passage 194 is formed. The above-described gas supply pipe 191 is connected to the gas flow passage 194 of the distribution plate 193.

The end portion of the gas supply pipe 191 opposite to the distribution plate 193 side is connected to an inert gas supply source 195 that supplies, for example, a nitrogen gas as the inert gas. Further, the gas flow passage 194 of the distribution plate 193 is provided in a manner to branch into a plurality of portions from the side to which the gas supply pipe 191 is connected toward the porous plate 190 and formed to be able to supply the inert gas evenly within a plane of the porous plate 190. Therefore, the inert gas supplied from the inert gas supply source 195 is supplied evenly within a plane of the porous plate 190 via the distribution plate 193. Note that the inert gas is not limited to the nitrogen gas in this embodiment but may be any gas as long as it contains no oxygen atom.

As illustrated in FIG. 4, the first holding unit 110 and the second holding unit 111 are provided with a first cover 200 and a second cover 201 respectively. The first cover 200 and the second cover 201 are provided in a manner to cover the processing space 112 between the first holding unit 110 and the second holding unit 111 as will be described later. The first cover 200 is further provided with a third cover 202 in a manner to cover the porous plate 190.

Figure 9:
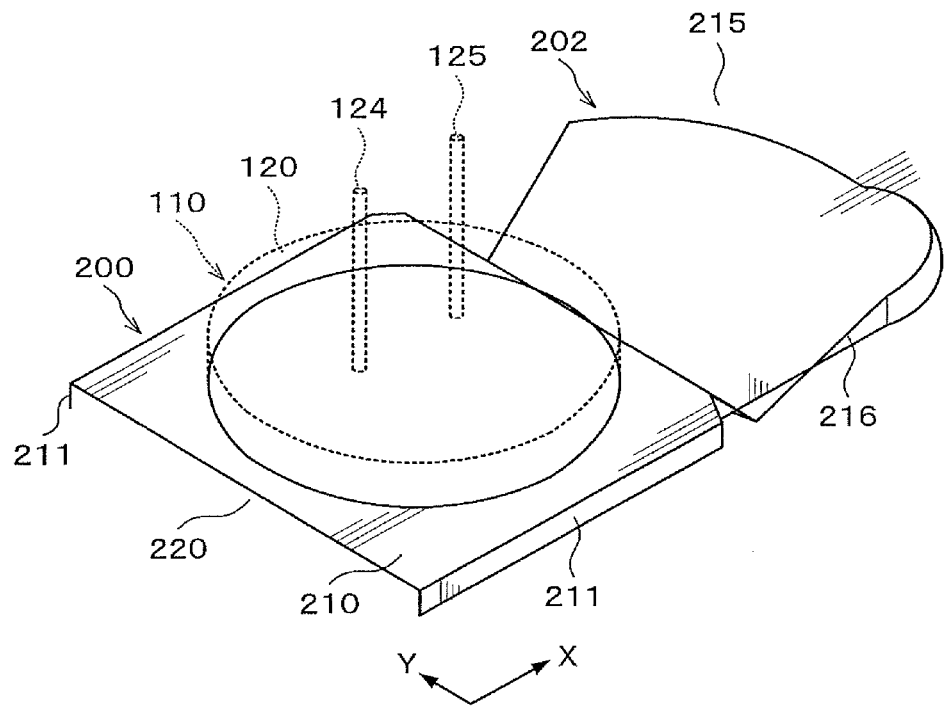
FIG. 9 A perspective view illustrating the outline of configurations of a first cover and a third cover.
Figure 10:
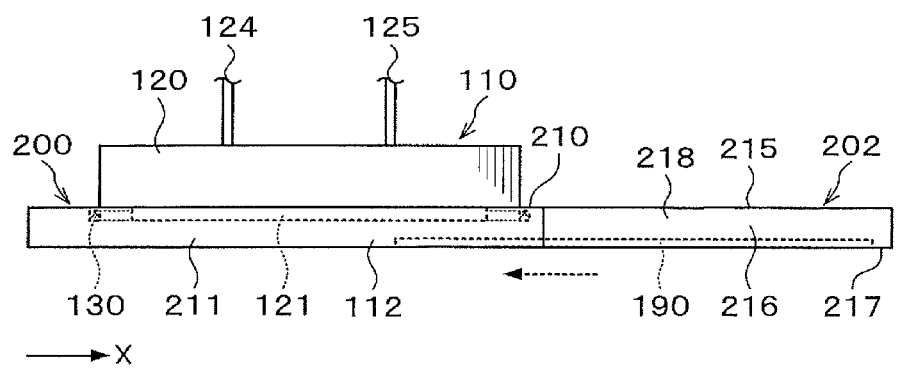
FIG. 10 A side view illustrating the outline of the configurations of the first cover and the third cover.

The first cover 200 has a flat plate part 210 and side wall parts 211 as illustrated in FIG. 9 and FIG. 10. A central portion of the flat plate part 210 is opened along the outer peripheral portion of the main body part 120 of the first holding unit 110, and the first cover 200 is attached to the first holding unit 110 in the opening. Further, the side wall parts 211 extend vertically downward from the flat plate part 210 and are provided along the moving direction (the X-direction in the drawing) of the second holding unit 111 and the porous plate 190. In other words, both end portions of the first cover 200 in the moving direction (the X-direction in the drawing) of the second holding unit 111 and the porous plate 190 are opened. Further, the side wall parts 211 are provided in a manner to cover the porous 121, the groove part 122, and the porous ring 130. Note that bent parts 212 horizontally extending inward from the side wall parts 211 are provided at the end portions on the X-direction positive direction side of the side wall parts 211 as will be described later.

Figure 11:
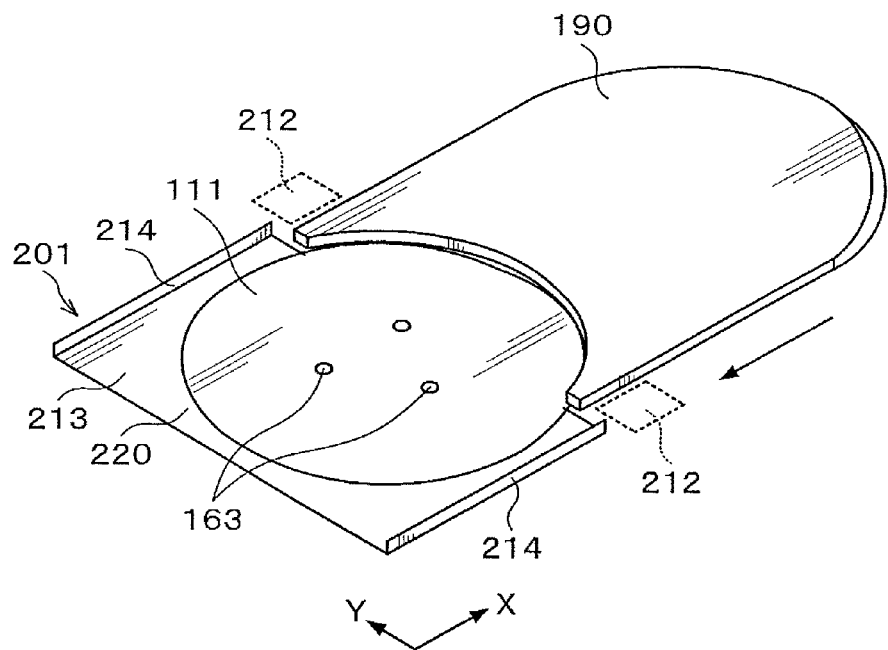
FIG. 11 A perspective view illustrating the outline of a configuration of a second cover.

The second cover 201 has a flat plate part 213 and side wall parts 214 as illustrated in FIG. 11. The flat plate part 213 is attached to the second holding unit 111 in a manner to cover almost ⅔ of the outer peripheral portion on the X-direction negative direction side of the second holding unit 111. In short, the flat plate part 213 is provided at a position not interfering with the porous plate 190 in a plan view. Note that at a position where the flat plate part 213 is not provided on the X-direction positive direction side of the second holding unit 111, the aforementioned bent parts 212 of the first cover 200 are disposed. Further, the side wall parts 214 extend vertically upward from the flat plate part 213 and are provided along the moving direction (the X-direction in the drawing) of the second holding unit 111 and the porous plate 190. In other words, both end portions of the second cover 201 in the moving direction (the X-direction in the drawing) of the second holding unit 111 and the porous plate 190 are opened.

Figure 12:
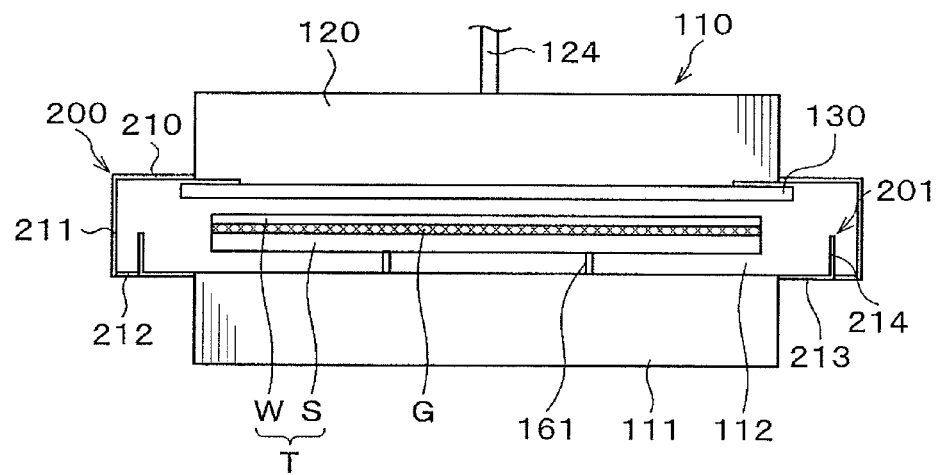
FIG. 12 A side view illustrating the outline of the configurations of the first cover and the second cover.

The first cover 200 and the second cover 201 are arranged in a manner to cover the processing space 112 between the first holding unit 110 and the second holding unit 111 as illustrated in FIG. 12. The first holding unit 110 and the second holding unit 111 are provided, for example, such that the side wall parts 211 of the first holding unit 110 are located outside the side wall parts 214 of the second holding unit 111.

The third cover 202 has a ceiling part 215, a side wall part 216, and a bottom surface part 217 as illustrated in FIG. 9 and FIG. 10. The ceiling part 215 and the side wall part 216 are attached to the flat plate part 210 and the side wall parts 211 of the first cover 200 respectively. The ceiling part 215 and the bottom surface part 217 have flat plate shapes along the outer peripheral portion of the porous plate 190. Further, the side wall part 216 is arranged to connect the ceiling part 215 and the bottom surface part 217. As described above, the third cover 202 is provided in a manner to cover the porous plate 190, and a waiting space 218 for the porous plate 190 is formed inside the third cover 202. Further, an end portion of the third cover 202 in the moving direction (in the X-direction negative direction) of the porous plate 190 is opened. Note that the bottom surface part 217 is formed with a cutout (not illustrated) to avoid interference with the gas supply pipe 191 and the supporting member 192.

As described above, the first cover 200, the second cover 201, and the third cover 202 are configured so that the second holding unit 111 and the porous plate 190 can move in the horizontal direction. Further, as illustrated in FIG. 4, the atmosphere in the space surrounded by the first cover 200, the second cover 201, and the third cover 202, namely, the atmosphere in the processing space 112 and in the waiting space 218 is exhausted from an opening 220 formed at the first cover 200 and the second cover 201 on the side opposite to the third cover 202. In short, the atmosphere in the processing space 112 and the waiting space 218 flows to the X-direction negative direction side in the drawing. Note that to actively exhaust the atmosphere in the processing space 112 and the waiting space 218, an exhaust apparatus 221 such as a vacuum pump may be provided at the opening 220.

Figure 13:
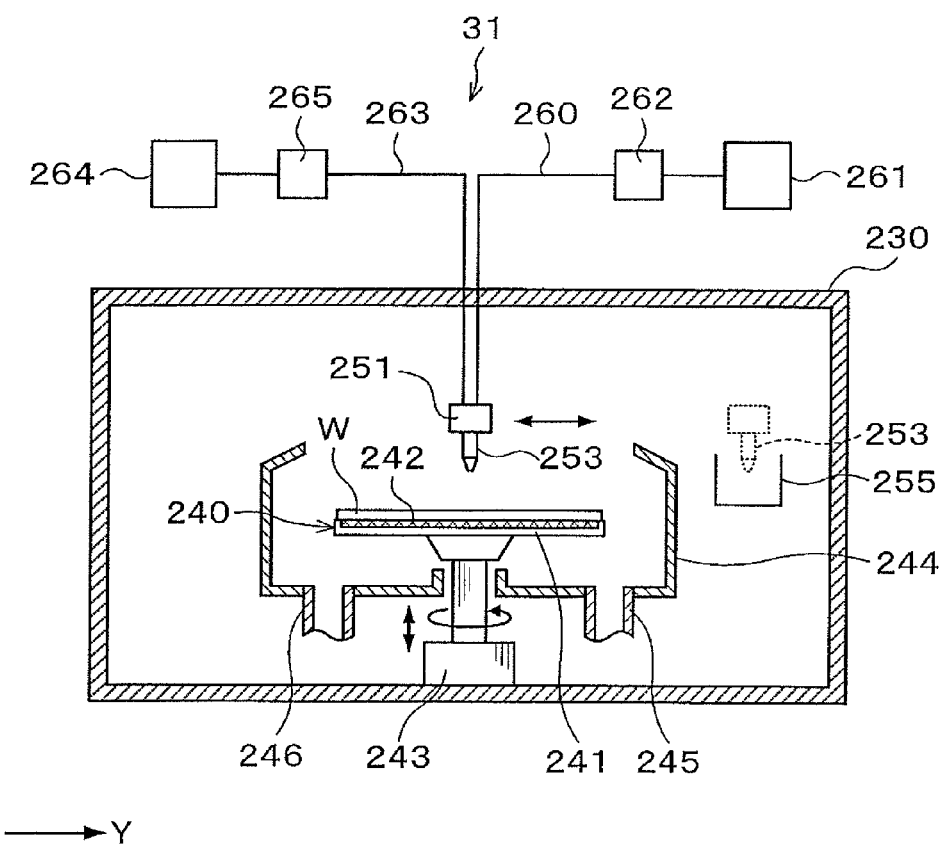
FIG. 13 A longitudinal sectional view illustrating the outline of a configuration of a first cleaning apparatus.

Next, the configuration of the above-described first cleaning apparatus 31 will be described. The first cleaning apparatus 31 has a treatment container 230 as illustrated in FIG. 13. In a side surface of the treatment container 230, a transfer-in/out port (not illustrated) for the processing target wafer W is formed, and an opening/closing shutter (not illustrated) is provided at the transfer-in/out port.

At a central portion inside the treatment container 230, a porous chuck 240 that holds and rotates the processing target wafer W thereon is provided. The porous chuck 240 has a main body part 241 in a flat plate shape and a porous 242 provided on the upper surface side of the main body part 241 and formed with a plurality of pores. The porous 242 has, for example, substantially the same diameter as that of the processing target wafer W and is in contact with the non-joint surface $W_N$ of the processing target wafer W. Note that as the porous 242, for example, silicon carbide is used. A suction pipe (not illustrated) is connected to the porous 242 and sucks the non-joint surface $W_N$ of the processing target wafer W from the suction pipe via the porous 242 and thereby can suction-hold the processing target wafer W on the porous chuck 240.

Below the porous chuck 240, a chuck driving unit 243 equipped with, for example, a motor is provided. The porous chuck 240 can rotate at a predetermined speed by means of the chuck driving unit 243. Further, the chuck driving unit 243 is provided with a raising and lowering driving source such as, for example, a cylinder so that the porous chuck 240 can freely rise and lower.

Around the porous chuck 240, a cup 244 is provided that receives and recovers liquid splashing or dropping from the processing target wafer W. A drain pipe 245 that drains the recovered liquid and an exhaust pipe 246 that vacuums and exhausts the atmosphere inside the cup 244 are connected to the lower surface of the cup 244.

Figure 14:
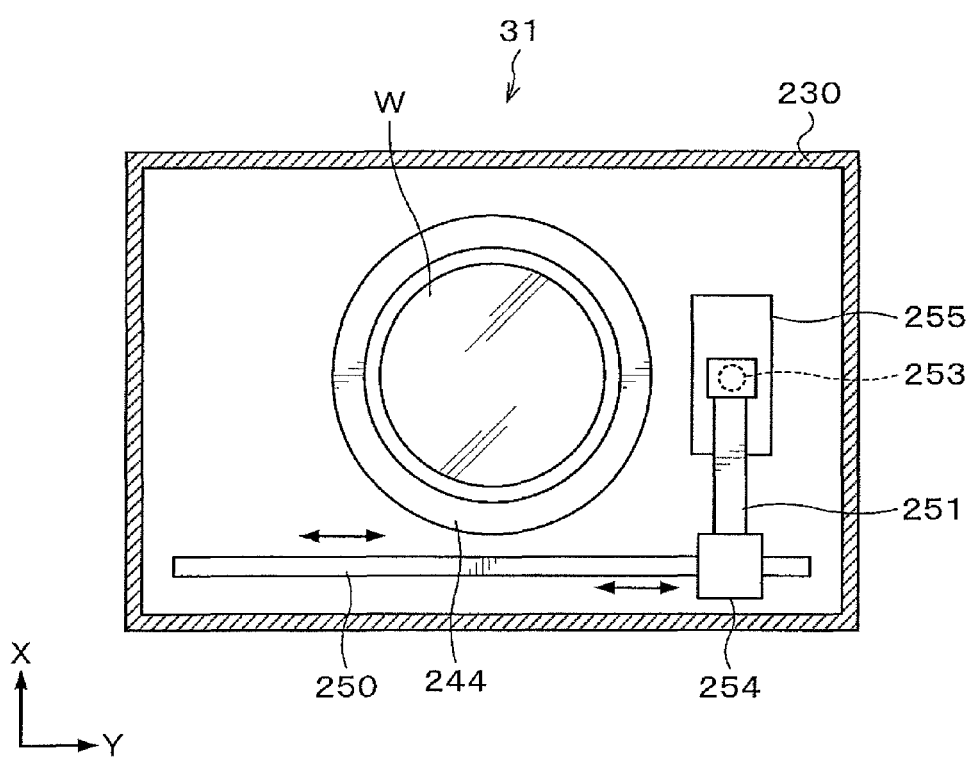
FIG. 14 A transverse sectional view illustrating the outline of the configuration of the first cleaning apparatus.

As illustrated in FIG. 14, on an X-direction negative direction (a downward direction in FIG. 14) side of the cup 244, a rail 250 that extends along a Y-direction (a right-left direction in FIG. 14) is formed. The rail 250 is formed, for example, from a Y-direction negative direction (a left direction in FIG. 14) side outer position of the cup 244 to a Y-direction positive direction (a right direction in FIG. 14) side outer position. On the rail 250, an arm 251 is attached.

On the arm 251, a cleaning solution nozzle 253 that supplies a cleaning solution, for example, an organic solvent to the processing target wafer W is supported as illustrated in FIG. 13 and FIG. 14. The arm 251 is movable on the rail 250 by means of a nozzle driving unit 254 illustrated in FIG. 14. Thus, the cleaning solution nozzle 253 can move from a waiting section 255 provided at the Y-direction positive direction side outer position of the cup 244 to a position above a central portion of the processing target wafer W in the cup 244, and further move in the diameter direction of the processing target wafer W above the processing target wafer W. Further, the arm 251 can freely rise and lower by means of the nozzle driving unit 254 to be able to adjust the height of the cleaning solution nozzle 253.

For the cleaning solution nozzle 253, for example, a two-fluid nozzle is used. To the cleaning solution nozzle 253, a supply pipe 260 that supplies the cleaning solution to the cleaning solution nozzle 253 is connected as illustrated in FIG. 13. The supply pipe 260 communicates with a cleaning solution supply source 261 that stores the cleaning solution therein. The supply pipe 260 is provided with a supply equipment group 262 including a valve, a flow regulator and so on that control the flow of the cleaning solution. Further, to the cleaning solution nozzle 253, a supply pipe 263 that supplies a nitrogen gas, for example, as an inert gas to the cleaning solution nozzle 253 is connected. The supply pipe 263 communicates with an inert gas supply source 264 that stores the inert gas therein. The supply pipe 263 is provided with a supply equipment group 265 including a valve, a flow regulator and so on that control the flow of the inert gas. Then, the cleaning solution and the inert gas are mixed together in the cleaning solution nozzle 253 and supplied from the cleaning solution nozzle 253 to the processing target wafer W. Note that the mixture of the cleaning solution and the inert gas is sometimes referred to simply as a "cleaning solution" hereinafter.

Incidentally, below the porous chuck 240, raising and lowering pins (not illustrated) to support the processing target wafer W from below and raise and lower it may be provided. In this case, the raising and lowering pins are configured to be able to pass through through holes (not illustrated) formed in the porous chuck 240 and project from the upper surface of the porous chuck 240. Then, in place of raising and lowering the porous chuck 240, the raising and lowering pins are raised or lowered to deliver the processing target wafer W to/from the porous chuck 240. Note that the configurations of the above-described joint surface cleaning unit 8a and the non-joint surface cleaning unit 8b of the above-described post-inspection cleaning apparatus 8 are the same as those of the first cleaning apparatus 31, and therefore the description of the joint surface cleaning unit 8a and the non-joint surface cleaning unit 8b is omitted.

Figure 15:
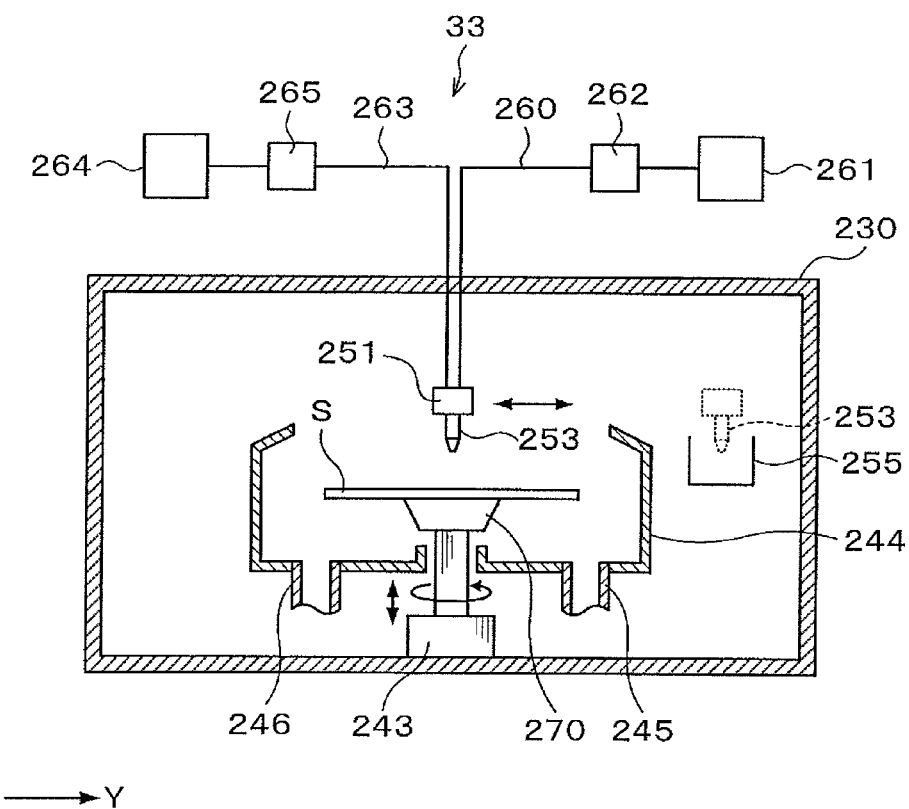
FIG. 15 A longitudinal sectional view illustrating the outline of a configuration of a second cleaning apparatus.

Further, the configuration of the second cleaning apparatus 33 is substantially the same as the configuration of the above-described first cleaning apparatus 31. In the second cleaning apparatus 33, a spin chuck 270 is provided as illustrated in FIG. 15 in place of the porous chuck 240 of the first cleaning apparatus 31. The spin chuck 270 has a horizontal upper surface, and a suction port (not illustrated) that sucks, for example, the supporting wafer S is provided in the upper surface. By suction through the suction port, the supporting wafer S can be suction-held on the spin chuck 270. The other configuration of the second cleaning apparatus 33 is the same as that of the above-described first cleaning apparatus 31, and therefore the description thereof is omitted.

Incidentally, in the second cleaning apparatus 33, a back rinse nozzle (not illustrated) that jets a cleaning solution toward the rear surface of the supporting wafer S, namely, the non-joint surface $S_N$ may be provided below the spin chuck 270. The cleaning solution jetted from the back rinse nozzle cleans the non-joint surface $S_N$ of the supporting wafer S and the outer peripheral portion of the supporting wafer S.

Figure 16:
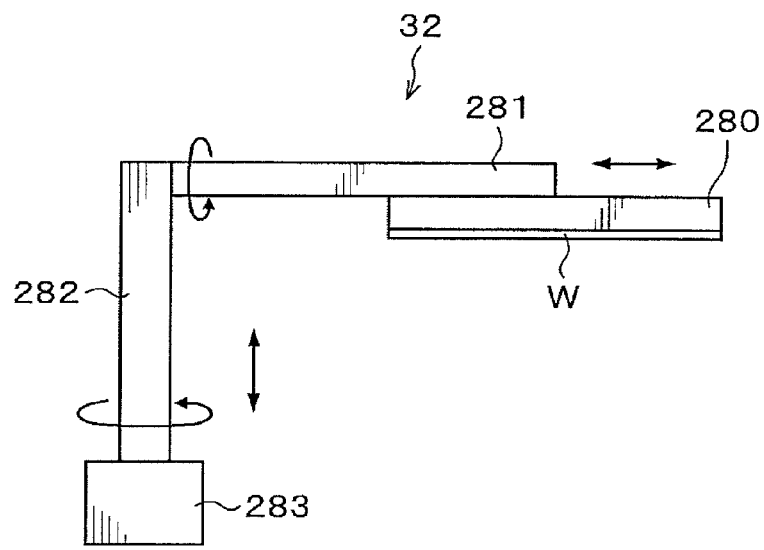
FIG. 16 A side view illustrating the outline of a configuration of a second transfer apparatus.

Next, the configuration of the above-described second transfer apparatus 32 will be described. The second transfer apparatus 32 has a Bernoulli chuck 280 that holds the processing target wafer W as illustrated in FIG. 16. The Bernoulli chuck 280 is supported by a supporting arm 281. The supporting arm 281 is supported by a first driving unit 282. By means of the first driving unit 282, the supporting arm 281 can turn around the horizontal axis and expand and contract in the horizontal direction. At a lower portion of the first driving unit 282, a second driving unit 283 is provided. By means of the second driving unit 283, the first driving unit 282 can rotate around the vertical axis and rise and lower in the vertical direction.

Figure 17:
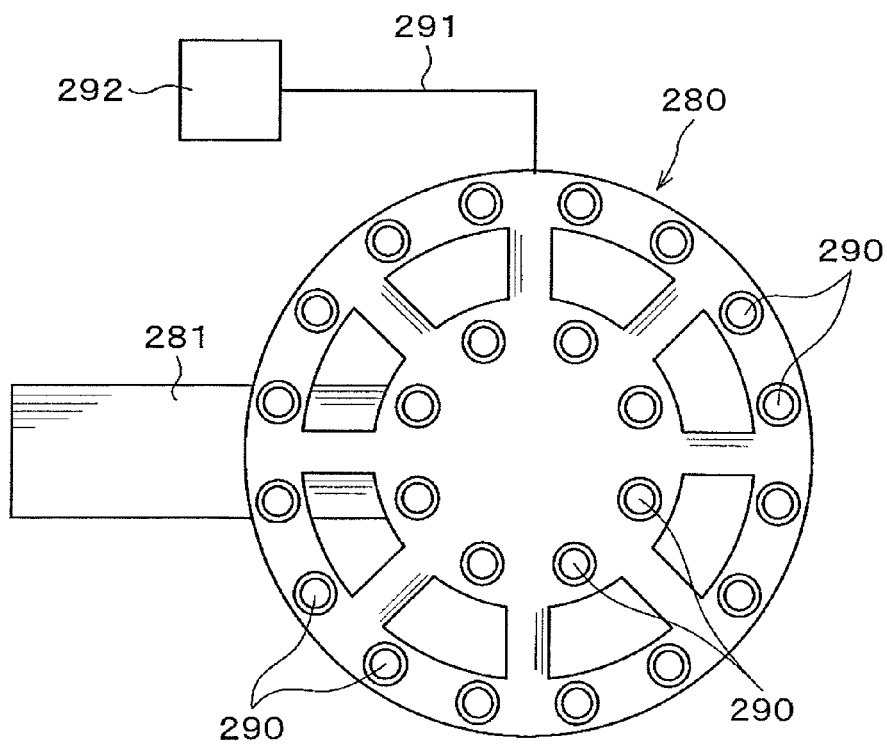
FIG. 17 A plan view illustrating the outline of a configuration of a Bernoulli chuck.

In the Bernoulli chuck 280, a plurality of gas jetting ports 290 that jet, for example, a nitrogen gas, as an inert gas are arranged as illustrated in FIG. 17. In the illustrated example, the plurality of gas jetting ports 290 are arranged at regular intervals on double concentric circles being concentric circles of the Bernoulli chuck 280. To the gas jetting ports 290, an inert gas supply source 292 that supplies the inert gas is connected via a gas supply pipe 291. The Bernoulli chuck 280 jets the inert gas to float the processing target wafer W and sucks and suspends the processing target wafer W to hold it in a non-contact state. Note that the number and arrangement of the gas jetting ports 290 are not limited to this embodiment buy can be arbitrarily set.

Note that the third transfer apparatus 41 has the same configuration as that of the above-described second transfer apparatus 32, and therefore the description thereof is omitted. However, a second driving unit 283 of the third transfer apparatus 41 is attached to the transfer path 40 illustrated in FIG. 1 so that the third transfer apparatus 41 is movable on the transfer path 40.

In the above separation system 1, a control unit 300 is provided as illustrated in FIG. 1. The control unit 300 is, for example, a computer and has a program storage part (not illustrated). In the program storage part, a program is stored which controls the processing on the processing target wafer W, the supporting wafer S, and the superposed wafer T in the separation system 1. Further, the program storage part also stores a program for controlling the operation of the driving system such as the above-described various processing and treatment apparatuses and transfer apparatuses to implement the later-described separation processing in the separation system 1. Note that the program may be the one that is stored, for example, in a computer-readable storage medium H such as a computer-readable hard disk (HD), flexible disk (FD), compact disk (CD), magneto-optical disk (MO), or memory card, and installed from the storage medium H into the control unit 300.

Figure 18:
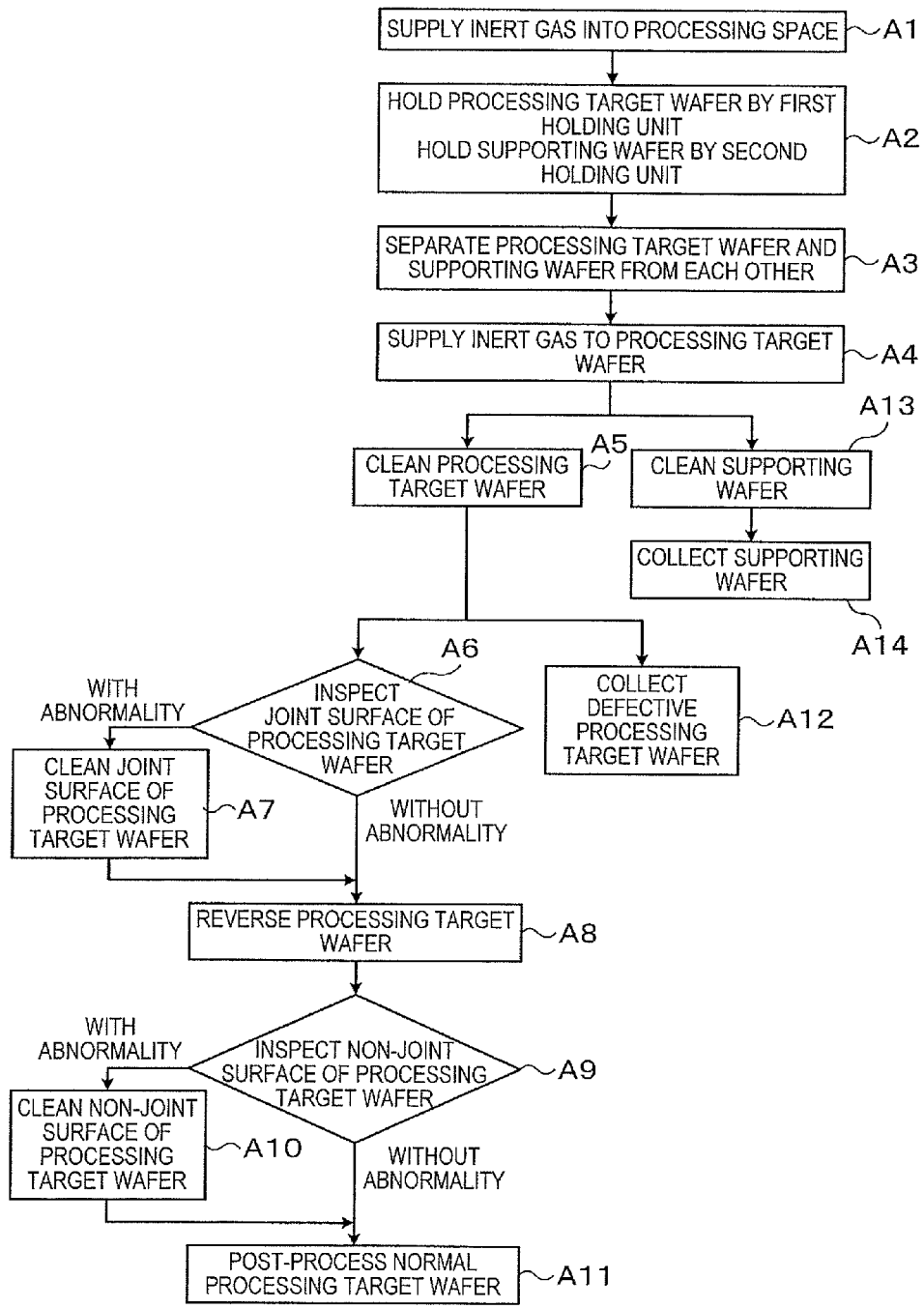
FIG. 18 A flowchart illustrating main steps of separation processing.

Next, the separation processing method of the processing target wafer W and the supporting wafer S performed using the separation system 1 configured as described above will be described. FIG. 18 is a flowchart illustrating an example of main steps of the separation processing.

First, a cassette $C_T$ housing a plurality of superposed wafers T, an empty cassette $C_W$, and an empty cassette $C_S$ are mounted on the predetermined cassette mounting plates 11 in the transfer-in/out station 2. The superposed wafer T in the cassette $C_T$ is taken out by the first transfer apparatus 20 and transferred to the separation apparatus 30 in the separation processing station 3. In this event, the superposed wafer T is transferred with the processing target wafer W arranged on the upper side and the supporting wafer S arranged on the lower side.

Figure 19:
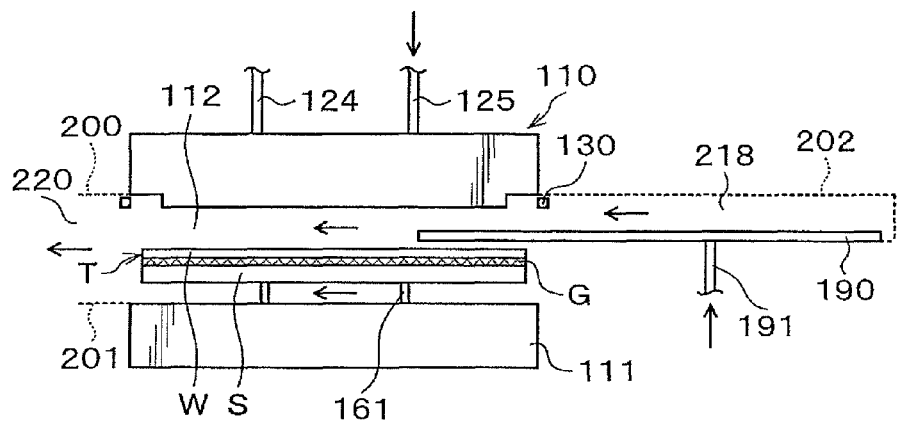
FIG. 19 An explanatory view illustrating the appearance in which the inert gas is supplied into a processing space with a superposed wafer held on raising and lowering pins.

The superposed wafer T transferred in the separation apparatus 30 is delivered to the raising and lowering pins 161 which have been raised and waiting in advance as illustrated in FIG. 12 and FIG. 19. Then, the second holding unit 111 is raised by the moving mechanism 170 to a predetermined position, and the inert gas is supplied into the processing space 112 from the gas supply pipe 125 and the gas supply pipe 191 with the superposed wafer T held on the raising and lowering pins 161 in the processing space 112 (step A1 in FIG. 18).

In this event, the second holding unit 111 is disposed at a position where, for example, the distance in the vertical direction of the processing space 112 is about 10 mm. Further, the superposed wafer T is in a state of being held on the raising and lowering pins 161 in the processing space 112, and disposed at a position where it is not in contact with any of the first holding unit 110 and the second holding unit 111. Therefore, the superposed wafer T is never heated by the heating mechanisms 128, 151. Then, in the state that the superposed wafer T is held on the raising and lowering pins 161, the inert gas is supplied from the gas supply pipe 125 and the gas supply pipe 191. The inert gas supplied from the gas supply pipe 125 flows through the inside of the processing space 112, namely, both sides above and below the superposed wafer T and is then exhausted from the opening 220. Further, the inert gas supplied from the gas supply pipe 191 via the porous plate 190 also flows through the inside of the waiting space 21 and the processing space 112 and is then exhausted from the opening 220. Thus, the atmosphere inside the processing space 112 where the superposed wafer T is to be separated is replaced with the inert gas, and the atmosphere is maintained at a predetermined low oxygen concentration at the ppm level.

In step A1, the volume capacity of the processing space 112 is reduced by raising the second holding unit 111, so that the atmosphere in the processing space 112 reaches the predetermined low oxygen concentration in a short time. Further, the inert gas is being supplied to the inside of the processing space 112 without heating of the superposed wafer T, thereby enabling suppression of oxidation of the non-joint surface $W_N$ of the processing target wafer W.

Figure 20:
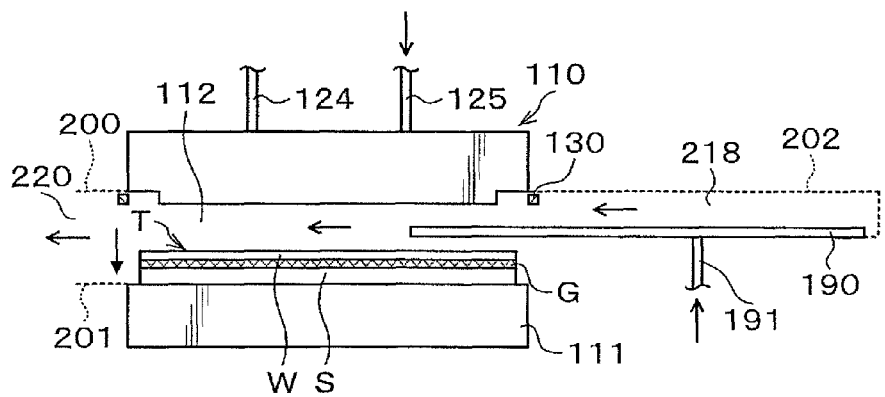
FIG. 20 An explanatory view illustrating the appearance in which the superposed wafer is mounted on a second holding unit.
Figure 21:
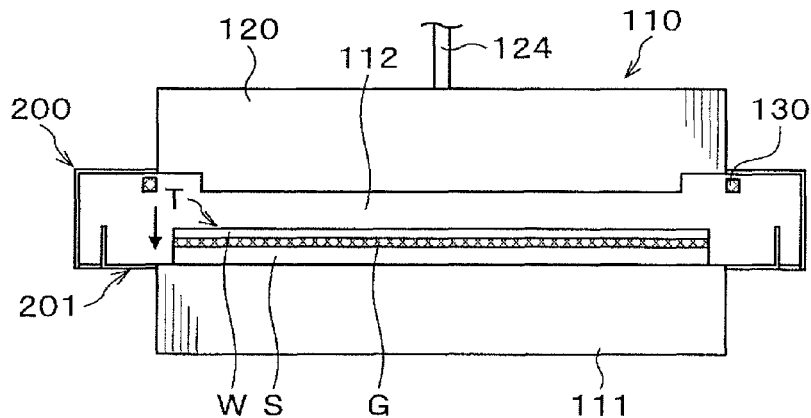
FIG. 21 An explanatory view illustrating the appearance in which the superposed wafer is mounted on the second holding unit.

Thereafter, the raising and lowering pins 161 are lowered to mount the superposed wafer T on the second holding unit 111 as illustrated in FIG. 20 and FIG. 21. Subsequently, the superposed wafer T is sucked from the suction pipe 150, and the non-joint surface $S_N$ of the supporting wafer S is suction-held by the second holding unit 111 (step A2 in FIG. 18). In this event, the supply of the inert gas from the gas supply pipe 125 and the gas supply pipe 191 to the processing space 112 is continued. Note that when mounting the superposed wafer T on the second holding unit 111, the second holding unit 111 may be raised by the moving mechanism 170.

Figure 22:
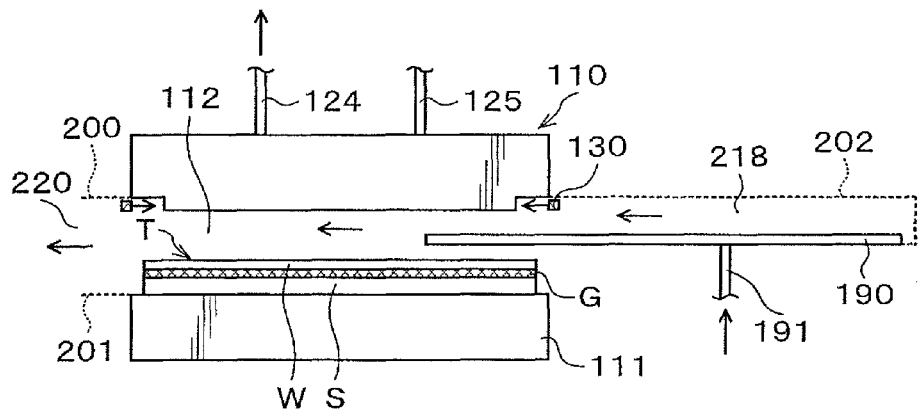
FIG. 22 An explanatory view illustrating the appearance in which suction from a suction pipe and supply of the inert gas from the porous ring are started.
Figure 23:
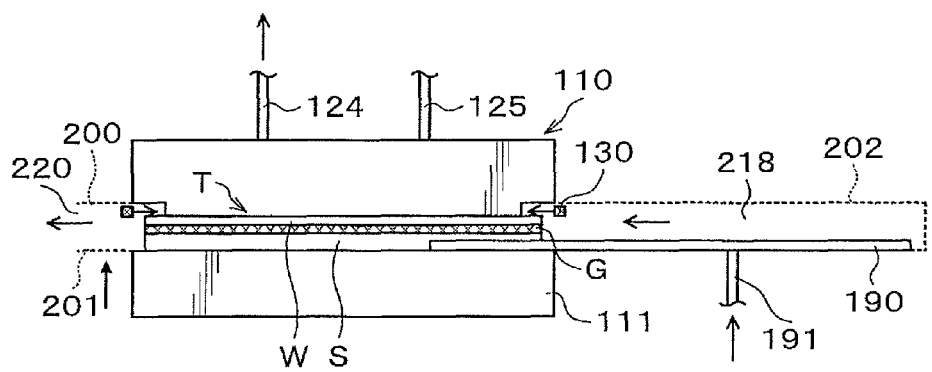
FIG. 23 An explanatory view illustrating the appearance in which the superposed wafer is held by the first holding unit and the second holding unit.
Figure 24:
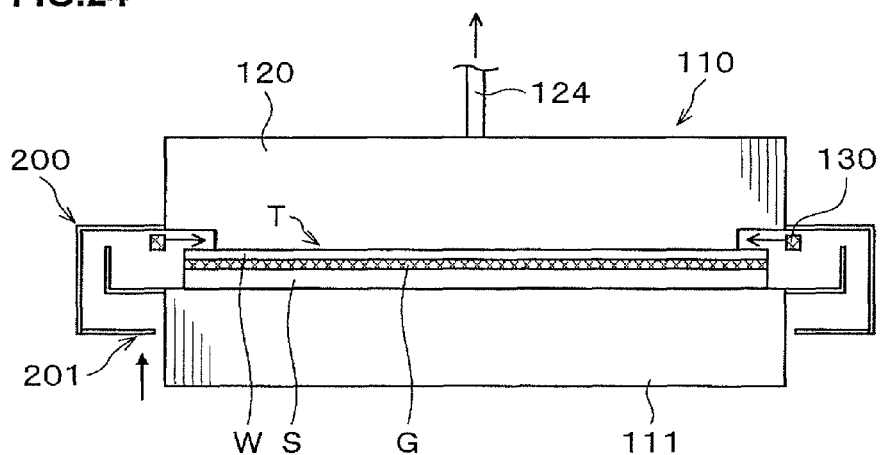
FIG. 24 An explanatory view illustrating the appearance in which the superposed wafer is held by the first holding unit and the second holding unit.

Thereafter, as illustrated in FIG. 22, the supply of the inert gas from the gas supply pipe 125 is stopped and the suction from the suction pipe 124 is started as illustrated in FIG. 22. Further, the inert gas is supplied from the porous ring 130 to the outer peripheral portion of the first holding unit 110. Subsequently, as illustrated in FIG. 23 and FIG. 24, the second holding unit 111 is raised by the moving mechanism 170 so that the first holding unit 110 suction-holds the non-joint surface $W_N$ of the processing target wafer W (step A2 in FIG. 18).

As described above, when the first holding unit 110 suction-holds the processing target wafer W, the inert gas is supplied from the porous ring 130 to the outer peripheral portion of the first holding unit 110. In this event, the inert gas is supplied from the porous ring 130 formed with the plurality of pores, so that the flow rate of the inert gas is suppressed. Thus, when supplying the inert gas, only the inert gas is supplied to the outer peripheral portion of the first holding unit 110 without involving the surrounding air thereinto. In addition, the inert gas is supplied to the groove part 122 between the first holding unit 110 and the processing target wafer W, so that the inside of the groove part 122 is made into an atmosphere of the inert gas. Then, even if devices are formed on the non-joint surface $W_N$ of the processing target wafer W, namely, even when a gap is generated between the holding surface 121a of the first holding unit 110 and the non-joint surface $W_N$ of the processing target wafer W, only the inert gas supplied from the porous ring 130 via the groove part 122 flows into the gap. Accordingly, the oxidation of the non-joint surface $W_N$ of the processing target wafer W which has been subjected to heat treatment can be suppressed.

Thereafter, the superposed wafer T is heated by the heating mechanisms 128, 151 to a predetermined temperature, for example, 200° C. Thus, the adhesive G in the superposed wafer T is softened. In this event, the supply of the inert gas from the gas supply pipe 191 is continuously performed. In other words, the inert gas is supplied from the upper surface of the porous plate 190 via the gas supply pipe 191 and the distribution plate 193. In this event, the supply of the inert gas via the porous plate 190 formed with the plurality of fine pores can suppress the flow rate of the inert gas supplied from the porous plate 190. Therefore, when supplying the inert gas, the surrounding air is never involved therein. Accordingly, the atmosphere of the inert gas containing no air can be formed on the upper surface side of the porous plate 190. Further, the gas flow passage 194 provided in a manner to branch into a plurality of portions toward the porous plate 190 is formed inside the distribution plate 193, so that the inert gas is evenly supplied from the entire surface on the upper surface side of the porous plate 190.

Figure 25:
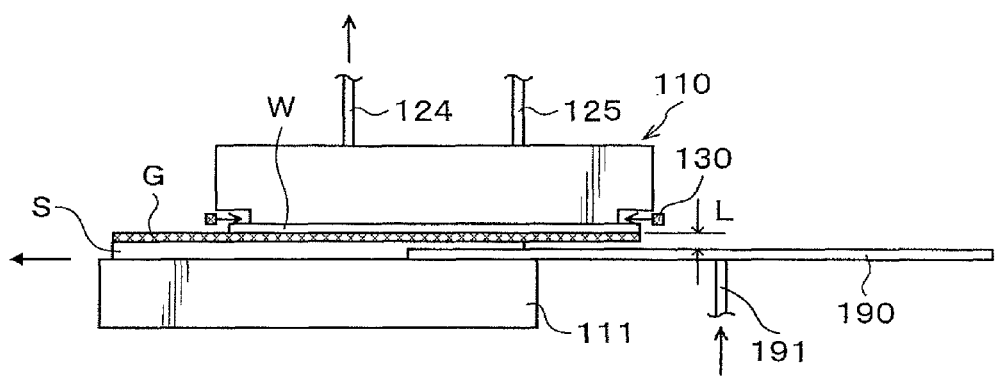
FIG. 25 An explanatory view illustrating the appearance in which the second holding unit is moved in the horizontal direction.

Subsequently, while keeping the softened state of the adhesive G by heating the superposed wafer T, the second holding unit 111 and the supporting wafer S are moved in the horizontal direction as illustrated in FIG. 25 by the moving mechanism 170. Further, the porous plate 190 is supported on the horizontal moving unit 172 by the supporting body 181, and therefore moved in the horizontal direction in synchronization with the second holding unit 111 accompanying the movement of the horizontal moving unit 172.

In this event, since the porous plate 190 is distanced from the joint surface $W_J$ of the processing target wafer W by a predetermined distance L in the vertical direction as illustrated in FIG. 25, the porous plate 190 is moved in the horizontal direction without interfering with the joint surface $W_J$ of the processing target wafer W. Therefore, the joint surface $W_J$ of the processing target wafer W exposed due to the movement is brought into a state of facing the porous plate 190 and distanced from the porous plate 190 by the distance L. During this time, the inert gas is supplied to the joint surface $W_J$ of the processing target wafer W from the porous plate 190.

Figure 26:
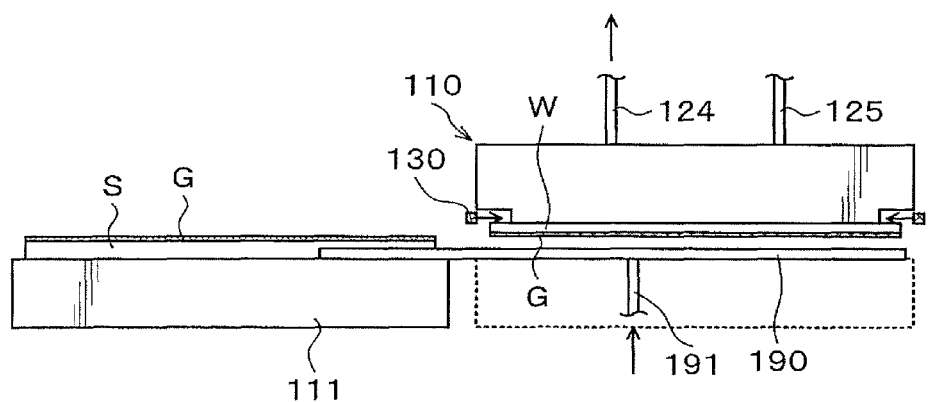
FIG. 26 An explanatory view illustrating the appearance in which the processing target wafer and the supporting wafer are separated from each other.

Thereafter, while the supply of the inert gas from the porous plate 190 is continued, the second holding unit 111 is moved in the horizontal direction to separate the processing target wafer W held by the first holding unit 110 and the supporting wafer S held by the second holding unit 111 from each other as illustrated in FIG. 26 (step A3 in FIG. 18). In this event, the inert gas from the porous plate 190 is continuously supplied also to the joint surface $W_J$ of the processing target wafer W for which the separation has been completed since the porous plate 190 is formed in a size capable of covering the processing target wafer W in a plan view.

Figure 27:
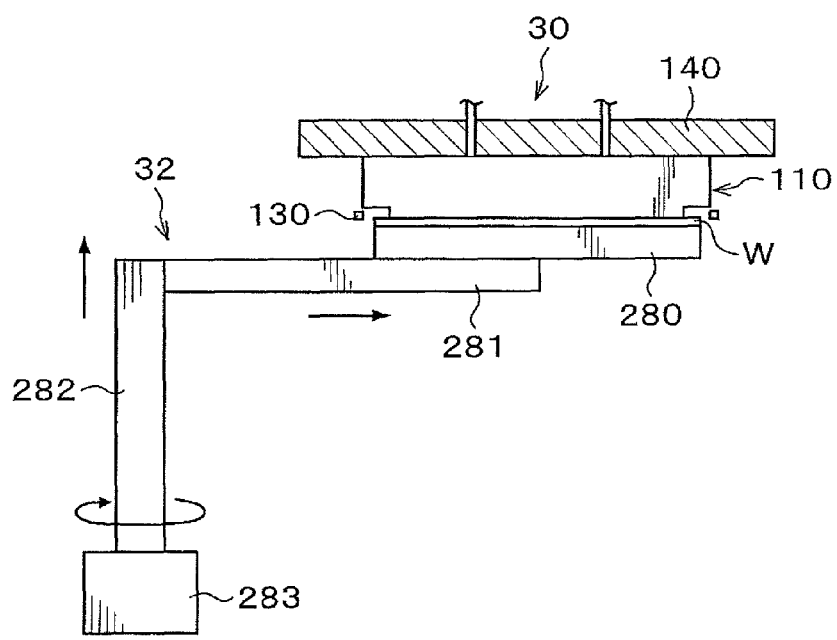
FIG. 27 An explanatory view illustrating the appearance in which the processing target wafer is delivered from the first holding unit to the Bernoulli chuck.

Thereafter, the processing target wafer W separated in the separation apparatus 30 is delivered from the first holding unit 110 to the Bernoulli chuck 280 of the second transfer apparatus 32 as illustrated in FIG. 27. As for the delivery of the processing target wafer W, first, the supporting arm 281 is extended to dispose the Bernoulli chuck 280 under the processing target wafer W held by the first holding unit 110. Thereafter, the Bernoulli chuck 280 is raised, and the suction of the processing target wafer W from the suction pipe 124 in the first holding unit 110 is stopped. Then, the processing target wafer W is delivered from the first holding unit 110 to the Bernoulli chuck 280. Thereafter, the Bernoulli chuck 280 is lowered to a predetermined position. Note that the processing target wafer W is held in a non-contact state by the Bernoulli chuck 280. Therefore, the processing target wafer W is held without damage to the devices on the joint surface $W_J$ of the processing target wafer W. Note that the second holding unit 111 is moved to a position where it faces the first holding unit 110.

Figure 28:
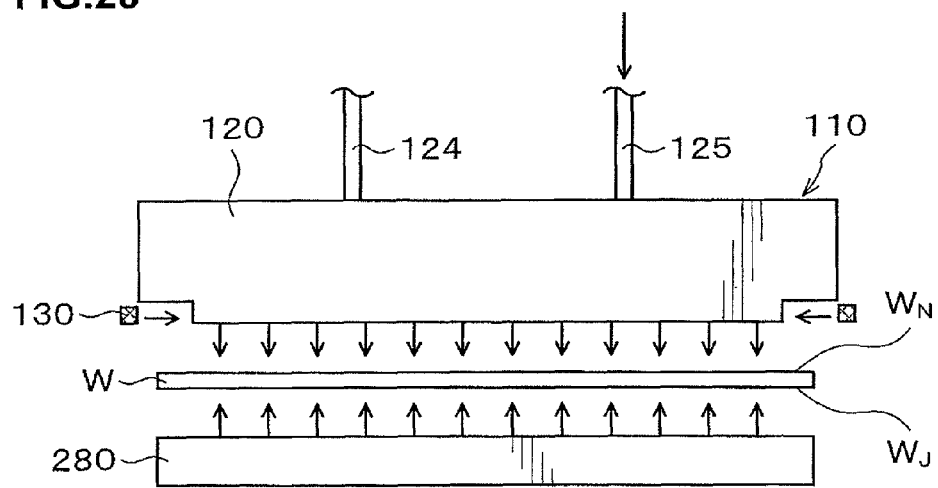
FIG. 28 An explanatory view illustrating the appearance in which the inert gas is supplied to the processing target wafer held by the Bernoulli chuck.

Thereafter, the inert gas is supplied from the gas supply pipe 125 to the non-joint surface $W_N$ of the processing target wafer W as illustrated in FIG. 28. Further, the processing target wafer W is held by the Bernoulli chuck 280, and the inert gas is supplied from the Bernoulli chuck 280 to the joint surface $W_J$ of the processing target wafer W (step A4 in FIG. 18). By supplying the inert gas to the processing target wafer W for a predetermined period, the processing target wafer W is cooled to a predetermined temperature, for example, equal to or lower than 100° C. to 150° C. Then, after the state where the oxidation at the joint surface $W_J$ and the non-joint surface $W_N$ does not proceed any longer is established, the supply of the inert gas from the gas supply pipe 125 is stopped.

Note that when cooling the processing target wafer W, the supply of the inert gas from the porous ring 130 may be performed continuously from step A3. In this case, the inert gas is supplied to the first holding unit 110, and a part of the inert gas is supplied to the non-joint surface $W_N$ of the processing target wafer W.

Figure 29:
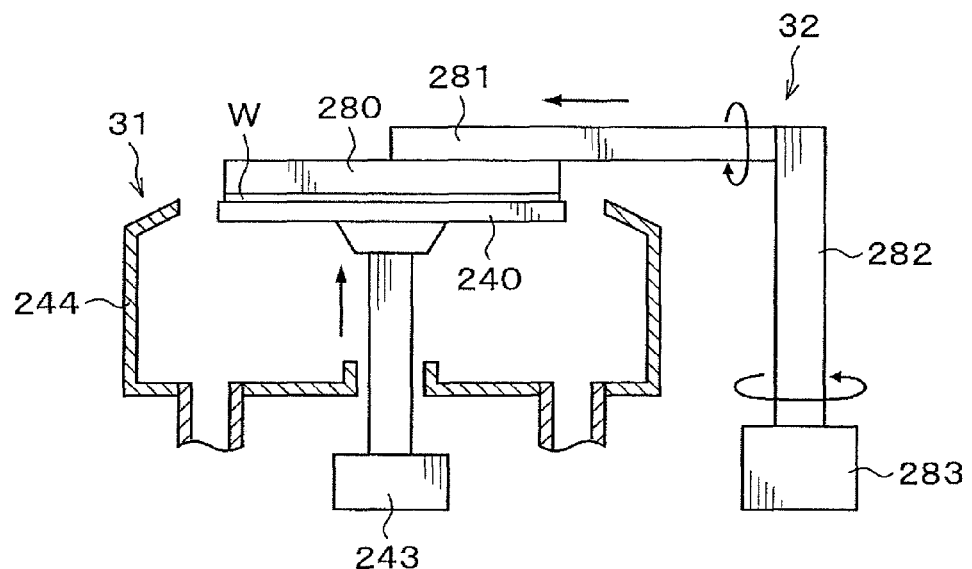
FIG. 29 An explanatory view illustrating the appearance in which the processing target wafer is delivered from the Bernoulli chuck to a porous chuck.

Thereafter, the processing target wafer W cooled to the predetermined temperature is transferred, while held by the Bernoulli chuck 280, to the first cleaning apparatus 31 by the second transfer apparatus 32 as illustrated in FIG. 29. As for the transfer of the processing target wafer W, the supporting arm 281 is turned to move the Bernoulli chuck 280 to above the porous chuck 240 of the first cleaning apparatus 31, and the Bernoulli chuck 280 is reversed to face the processing target wafer W downward. In this event, the porous chuck 240 has been raised to above the cup 244 and kept waiting. Thereafter, the processing target wafer W is delivered from the Bernoulli chuck 280 to the porous chuck 240 and suction-held.

After the processing target wafer W is suction-held on the porous chuck 240, the porous chuck 240 is lowered to a predetermined position. Subsequently, the cleaning solution nozzle 253 at the waiting section 255 is moved by the arm 251 to above the central portion of the processing target wafer W. Then, while the processing target wafer W is being rotated by the porous chuck 240, the cleaning solution is supplied from the cleaning solution nozzle 253 to the joint surface $W_J$ of the processing target wafer W. The supplied cleaning solution is diffused over the entire surface of the joint surface $W_J$ of the processing target wafer W by the centrifugal force to clean the joint surface $W_J$ of the processing target wafer W (step A5 in FIG. 18).

Here, the plurality of superposed wafers T transferred in the transfer-in/out station 2 have been subjected to inspection in advance as described above and discriminated between a superposed wafer T including a normal processing target wafer W and a superposed wafer T including a defective processing target wafer W.

The normal processing target wafer W separated from the normal superposed wafer T is cleaned at its joint surface $W_J$ in step A5 and then transferred by the third transfer apparatus 41 to the inspection apparatus 7. Note that the transfer of the processing target wafer W by the third transfer apparatus 41 is substantially the same as the above-described transfer of the processing target wafer W by the second transfer apparatus 32, and therefore the description thereof is omitted.

The inspection apparatus 7 inspects the presence or absence of a residue of the adhesive G on the joint surface $W_J$ of the processing target wafer W (step A6 in FIG. 18). If a residue of the adhesive G is confirmed in the inspection apparatus 7, the processing target wafer W is transferred by the third transfer apparatus 41 to the joint surface cleaning unit 8a in the post-inspection cleaning apparatus 8, and the joint surface $W_J$ is cleaned in the joint surface cleaning unit 8a (step A7 in FIG. 18). After the joint surface $W_J$ is cleaned, the processing target wafer W is transferred by the third transfer apparatus 41 to the reversing unit 8c and reversed in the vertical direction in the reversing unit 8c. Note that if any residue of the adhesive G is not confirmed, the processing target wafer W is reversed in the reversing unit 8c without being transferred to the joint surface cleaning unit 8a (step A8 in FIG. 18).

Thereafter, the reversed processing target wafer W is transferred by the third transfer apparatus 41 again to the inspection apparatus 7 and subjected to inspection of the non-joint surface $W_N$ (step A9 in FIG. 18). If a residue of the adhesive G is confirmed on the non-joint surface $W_N$, the processing target wafer W is transferred by the third transfer apparatus 41 to the non-joint surface cleaning unit 8b, and the non-joint surface $W_N$ is cleaned (step A10 in FIG. 18). Then, the cleaned processing target wafer W is transferred by the third transfer apparatus 41 to the post-processing station 4. Note that if any residue of the adhesive G is not confirmed in the inspection apparatus 7, the processing target wafer W is transferred as it is to the post-processing station 4 without being transferred to the non-joint surface cleaning unit 8b.

Thereafter, predetermined post-processing is performed on the processing target wafer W in the post-processing station 4 (step A11 in FIG. 18). In this manner, the processing target wafer W becomes a product.

On the other hand, the defective processing target wafer W separated from the defective superposed wafer T is cleaned at its joint surface $W_J$ in step A5 and then transferred by the first transfer apparatus 20 to the transfer-in/out station 2. Thereafter, the defective processing target wafer W is transferred from the transfer-in/out station 2 to the outside and collected (step A12 in FIG. 18).

While the above-described steps A5 to A12 are being performed on the processing target wafer W, the supporting wafer S separated in the separation apparatus 30 is transferred by the first transfer apparatus 20 to the second cleaning apparatus 33. Then, in the second cleaning apparatus 33, the joint surface $S_J$ of the supporting wafer S is cleaned (step A13 in FIG. 18). Note that the cleaning of the supporting wafer S in the second cleaning apparatus 33 is the same as the above-described cleaning of the processing target wafer W in the first cleaning apparatus 31, and therefore the description thereof is omitted.

Thereafter, the supporting wafer S whose joint surface $S_J$ has been cleaned is transferred by the first transfer apparatus 20 to the transfer-in/out station 2. Then, the supporting wafer S is transferred from the transfer-in/out station 2 to the outside and collected (step A14 in FIG. 18). Thus, a series of separation processing of the processing target wafer W and the supporting wafer S ends.

According to the above embodiment, when the first holding unit 110 holds the processing target wafer W in steps A2 and A3, the inert gas is supplied to the outer peripheral portion of the first holding unit 110 from the porous ring 130 formed with the plurality of pores. This makes it possible to supply only the inert gas to the gap between the holding surface 121a of the first holding unit 110 and the non-joint surface $W_N$ of the processing target wafer W as described above. Accordingly, the oxidation of the non-joint surface $W_N$ of the processing target wafer W which has been subjected to heat treatment can be suppressed.

Further, the diameter of the holding surface 121a of the porous 121 in the first holding unit 110 is smaller than the diameter of the processing target wafer W, so that even when the adhesive G heated in step A3 flows around to the non-joint surface $W_N$ at the edge portion of the processing target wafer W, the adhesive G stays in the groove part 122 and never adheres to the porous 121. This makes it possible to prevent the processing target wafer W from being fixed to the porous 121, and appropriately deliver the processing target wafer W from the first holding unit 110 to the Bernoulli chuck 280 in step A4.

In addition, the inert gas from the porous ring 130 can be horizontally supplied to the groove part 122 formed between the first holding unit 110 and the processing target wafer W, thereby forming an inert gas atmosphere in the groove part 122. Accordingly, it is possible to more surely supply only the inert gas to the gap between the holding surface 121a of the first holding unit 110 and the non-joint surface $W_N$ of the processing target wafer W to further suppress the oxidation of the non-joint surface $W_N$ of the processing target wafer W which has been subjected to heat treatment.

Furthermore, the inert gas is supplied from the gas supply pipe 125 to the processing space 112 and the inert gas is also supplied from the gas supply pipe 191 to the processing space 112 via the waiting space 218 in step A1. In addition, the processing space 112 is covered with the first cover 200 and the second cover 201 and the waiting space 218 is covered with the third cover 202 so that the gas flow of the inert gas flowing through the inside of the processing space 112 and the waiting space 218 toward the opening 220 is formed. Thus, the inside of the processing space 112 can be filled with the inert gas and the atmosphere inside the processing space 112 can be maintained at a low oxygen concentration. Accordingly, the oxidation of the non-joint surface $W_N$ of the processing target wafer W can be suppressed in step A1. Furthermore, since the atmosphere inside the processing space 112 can be maintained at a low oxygen concentration also in a subsequent step A3, the oxidation of the joint surface $W_J$ of the processing target wafer W can be suppressed.

Further, the inert gas is supplied from the porous plate 190 to the joint surface $W_J$ of the processing target wafer W which has been exposed due to the movement of the second holding unit 111 in the horizontal direction by the moving mechanism 170 in step A3, thereby forming an inert gas atmosphere around the joint surface $W_J$ of the processing target wafer W which has been exposed due to separation. Accordingly, the oxidation of the joint surface $W_J$ of the heated processing target wafer W can be suppressed.

Further, since the porous plate 190 has a size capable of covering the processing target wafer W, the inert gas can be supplied to the entire surface of the joint surface $W_J$ of the separated processing target wafer W. Accordingly, the oxidation of the entire surface of the processing target wafer W can be suppressed.

Figure 30:
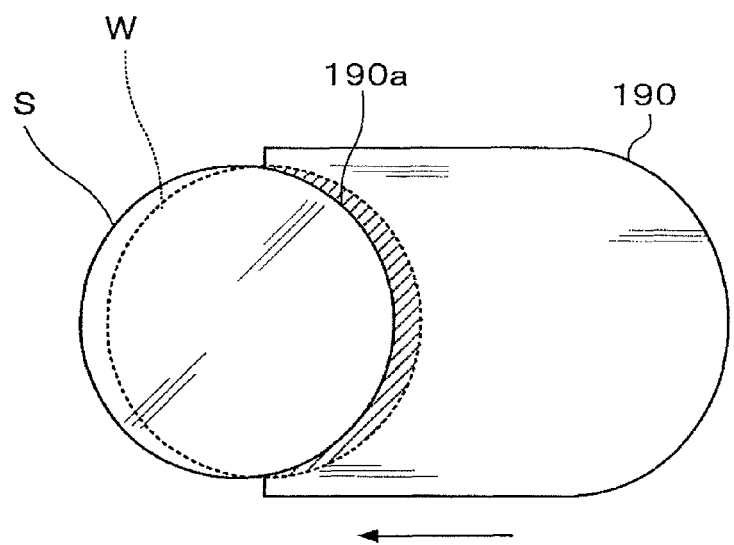
FIG. 30 An explanatory view illustrating the appearance in which the processing target wafer and the supporting wafer are relatively moved in the horizontal direction.

Further, since the hollow portion 190a which is hollowed in a recess shape along the shape of the processing target wafer W in a plan view is formed at the end portion in the moving direction of the porous plate 190, the porous plate 190 can be disposed at a position where the porous plate 190 comes into contact with the processing target wafer W in a plan view. This makes it possible to instantly supply the inert gas to the joint surface $W_J$ of the processing target wafer W which has been exposed due to the movement of the moving mechanism 170. More specifically, when the first holding unit 110 and the second holding unit 111 are relatively moved in the horizontal direction by the moving mechanism 170, the joint surface $W_J$ of the processing target wafer W is exposed in a falcate shape (a range indicated with diagonal lines in FIG. 30) as illustrated in FIG. 30. In this case, by forming the hollow portion 190a in the porous plate 190 and arranging the porous plate 190 in a manner that the hollow portion 190a is in contact with the processing target wafer W in a plan view, the entire surface of the exposed portion in the falcate shape can be covered with the porous plate 190. Accordingly, the inert gas can be instantly supplied to the entire surface of the exposed joint surface $W_J$. Incidentally, that the hollow portion 190a is in contact with the outer peripheral portion of the processing target wafer W in a plan view does not mean that the circumference of the hollow portion 190a is entirely in contact with the outer peripheral portion of the processing target wafer W because the diameter of an arc of a circle of the hollow portion 190a coincides with the diameter of the processing target wafer W, but means that when the joint surface $W_J$ of the processing target wafer W is exposed due to separation, the hollow portion 190a of the porous plate 190 is close to the outer peripheral portion of the processing target wafer W in a plan view to a degree at which the joint surface $W_J$ is covered with the inert gas atmosphere above the porous plate 190 without being exposed to the atmosphere in the processing container 100.

Further, in step A4, to the processing target wafer W held by the Bernoulli chuck 280, the inert gas is supplied from the Bernoulli chuck 280 to the joint surface $W_J$ and the inert gas is supplied from the gas supply pipe 125 to the non-joint surface $W_N$. Then, the processing target wafer W is cooled to the predetermined temperature, so that the oxidation does not proceed thereafter at the joint surface $W_J$ and the non-joint surface $W_N$ of the processing target wafer W. In addition, what is used for cooling the processing target wafer W is the inert gas, so that the oxidation of the joint surface $W_J$ and the non-joint surface $W_N$ of the processing target wafer W can be prevented also during the cooling.

Figure 31:
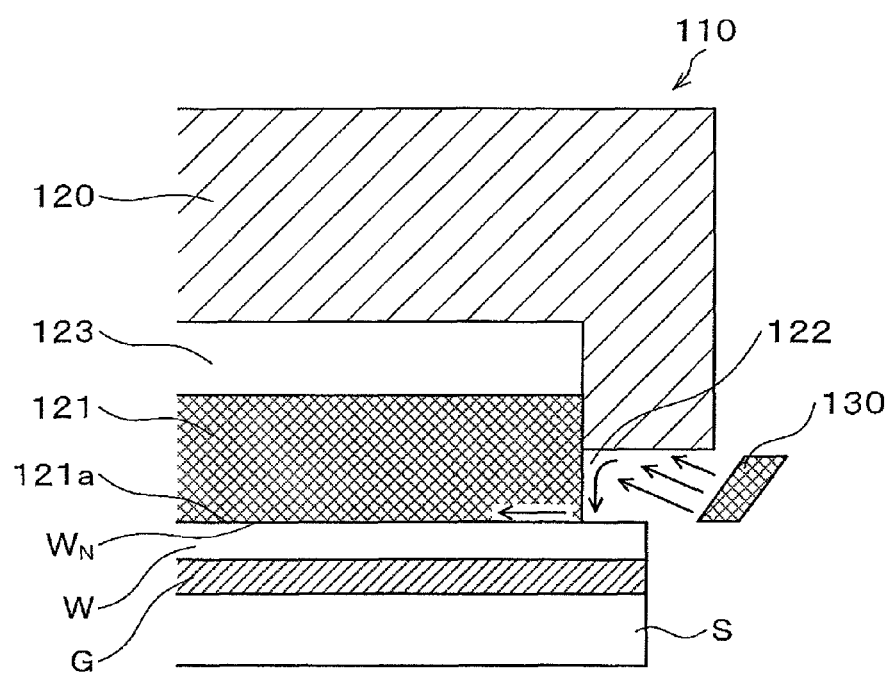
FIG. 31 A longitudinal sectional view illustrating the outline of configurations of the outer peripheral portion of the first holding unit and a porous ring according to another embodiment.

The porous ring 130 supplies the inert gas horizontally from the plurality of pores in the above embodiment, but may supply the inert gas obliquely upward from the plurality of pores as illustrated in FIG. 31. In this case, the inert gas supplied from the porous ring 130 to the groove part 122 collides against the bottom surface of the main body part 120 or the side surface of the porous 121 and diffuses by convection inside the groove part 122. Thus, the inside of the groove part 122 is filled with the inert gas. Accordingly, it is possible to supply only the inert gas to the gap between the holding surface 121a of the first holding unit 110 and the non-joint surface $W_N$ of the processing target wafer W, thereby suppressing the oxidation of the non-joint surface $W_N$ of the processing target wafer W which has been subjected to heat treatment.

Figure 32:
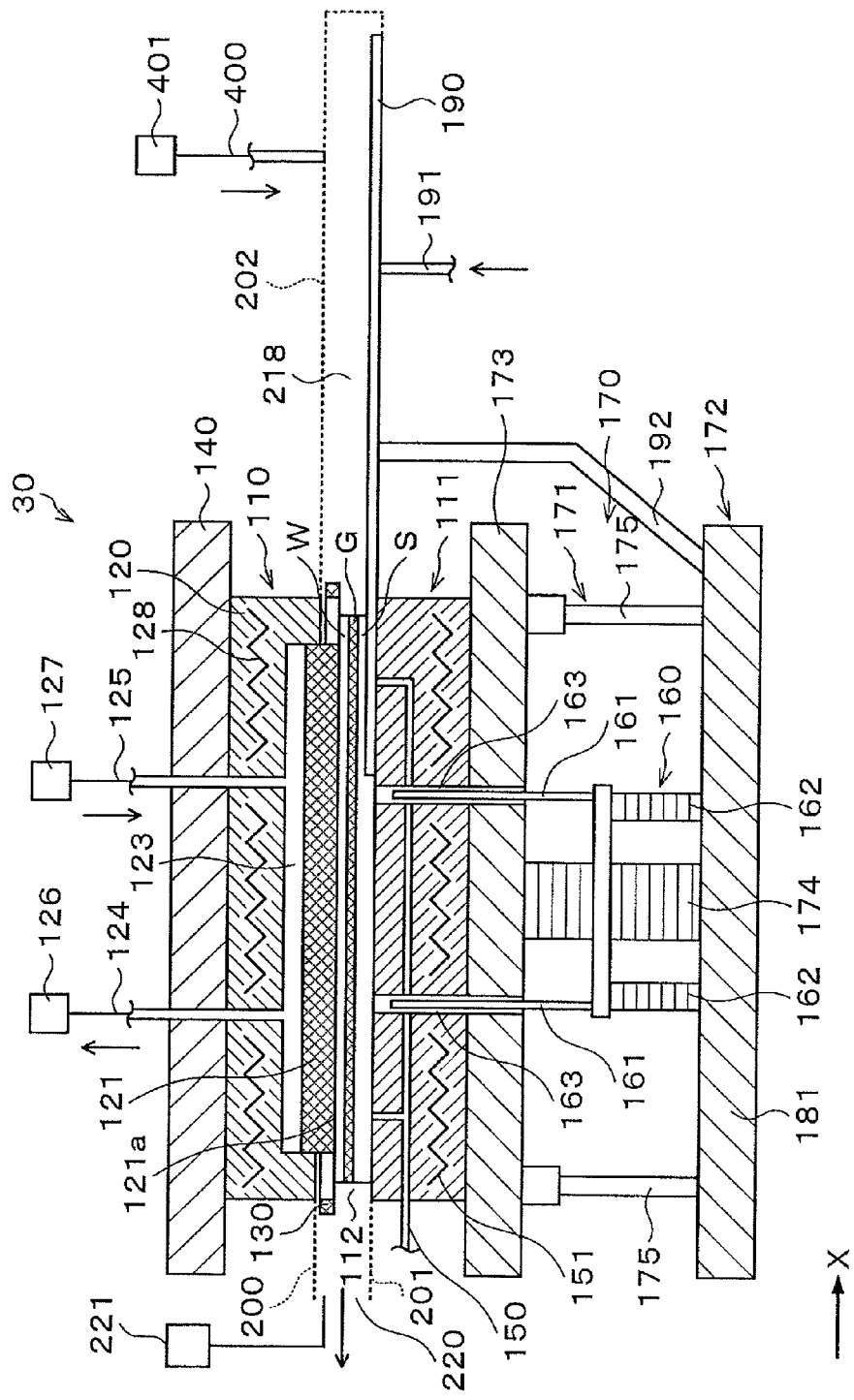
FIG. 32 A longitudinal sectional view illustrating the outline of an internal configuration of a separation apparatus according to another embodiment.

In the separation apparatus 30 in the above embodiment, an ion gas supply pipe 400 may be connected to the third cover 202 as illustrated in FIG. 32. The ion gas supply pipe 400 is provided with an ionizer 401 that ionizes, for example, a nitrogen gas as the inert gas. For example, in steps A1 to A3, the ionized inert gas is supplied from the ion gas supply pipe 400 into the waiting space 218, flows through the inside of the waiting space 218 and the processing space 112 in sequence, and is then exhausted from the opening 220. Note that the inert gas is not limited to the nitrogen gas in this embodiment but may be any gas as long as it contains no oxygen atom.

In this case, when the processing target wafer W and the supporting wafer S are separated from each other in step A3, separation electrification of the processing target wafer W can be neutralized by the ionized inert gas. In short, the damage to the processing target wafer W due to static electricity can be prevented. Further, by actively supplying the ionized inert gas from the ion gas supply pipe 400 into the waiting space 218, the gas flow of the inert gas flowing toward the opening 220 in the waiting space 218 and the processing space 112 can be more surely formed. Accordingly, the oxidation of the surface of the processing target wafer W in the processing space 112 can be further suppressed.

Note that the ion gas supply pipe 400 is connected to the ceiling part 215 of the third cover 202 in the illustrated example, but may be connected, for example, to the side wall part 216 of the third cover 202 at the end portion opposite to the opening in the of the third cover 202.

Though the silicon carbide is used for each of the porous ring 130 and the porous plate 190 in the above embodiment, materials of them are not limited to this embodiment. For example, Teflon (registered trademark) or the like may be used as long as the porous ring 130 and the porous plate 190 are formed with a plurality of fine pores that never involve surrounding air when supplying the inert gas.

Further, though the distance L between the porous plate 190 and the joint surface $W_J$ of the processing target wafer W is set to 2 mm in the above embodiment, the porous plate 190 can appropriately supply the inert gas to the joint surface $W_J$ of the processing target wafer W to preferably suppress the proceed of rapid oxidation as long as the distance L falls within a range of 0.5 mm to 4 mm.

Note that the porous plate 190 is disposed in parallel with the joint surface $W_J$ of the processing target wafer W in the above embodiment but does not always have to be parallel with the joint surface $W_J$ of the processing target wafer W. The porous plate 190 may be provided to be inclined with respect to the joint surface $W_J$ as long as the distance L between the porous plate 190 and the joint surface $W_J$ is maintained between 0.5 mm and 4 mm.

Furthermore, the inert gas supply sources 127, 132, 195 are separately provided in the separation apparatus 30 in the above embodiment, but a common inert gas supply source may be provided.

The second holding unit 111 is moved in the horizontal direction with respect to the first holding unit 110 in step A3 in the above embodiment, but the second holding unit 111 may be moved, for example, 100 μ-m in the vertical direction in addition to the movement in the horizontal direction.

For example, the moving distance in the horizontal direction of the second holding unit 111 is 300 mm, the thickness of the adhesive G in the superposed wafer T is, for example, 30 μm to 40 μm, and the height of the devices (bumps) formed on the joint surface $W_J$ of the processing target wafer W is, for example, 20 μm in this embodiment. In this case, the distance between the devices on the processing target wafer W and the supporting wafer S is minute. Hence, for example, when the second holding unit 111 is moved only in the horizontal direction, the devices and the supporting wafer S can come into contact with each other, whereby the devices may be damaged. Accordingly, moving the second holding unit 111 in the horizontal direction and also in the vertical direction can prevent the contact between the devices and the supporting wafer S to suppress the damage to the devices. Note that the ratio between the moving distance in the vertical direction and the moving distance in the horizontal direction of the second holding unit 111 is arbitrarily set based on the height of the devices (bumps) on the processing target wafer W but not limited to this embodiment.

Note that the first holding unit 110 may be moved in place of the second holding unit 111. Also in this case, the first holding unit 110 may be moved in the vertical direction and the horizontal direction. Alternatively, both of the first holding unit 110 and the second holding unit 111 may be moved in the vertical direction and the horizontal direction. Note that the porous plate 190 is only necessary to be configured to move in the horizontal direction relative to the processing target wafer W held by the first holding unit 110, namely, the object to which the inert gas is to be supplied even when either the holding unit 110 or 111 is moved, and its moving method and supporting method can be arbitrarily set. For example, when the first holding unit 110 is moved in the horizontal direction, the porous plate 190 may be supported on the ceiling surface of the processing container 100 or supported on the bottom surface of the processing container 100. In either case, by moving the processing target wafer W in the horizontal direction above the porous plate 190 in a state that the processing target wafer W is distanced from the porous plate 190 by the predetermined distance L, the atmosphere around the exposed joint surface $W_J$ of the processing target wafer W can be made the inert gas.

Further, instead of moving the second holding unit 111 in the vertical direction and the horizontal direction in step A3, the second holding unit 111 may be moved only in the horizontal direction and the moving speed of the second holding unit 111 may be changed. Specifically, the moving speed at the time to start the movement of the second holding unit 111 may be set to a low speed, and the moving speed may be then gradually increased. More specifically, since the joint area between the processing target wafer W and the supporting wafer S is large and the devices on the processing target wafer W are likely to be affected by the adhesive G at the time to start the movement of the second holding unit 111, the moving speed of the second holding unit 111 is set to a low speed. Since the devices on the processing target wafer W become more unlikely affected by the adhesive G as the joint area between the processing target wafer W and the supporting wafer S becomes smaller, the moving speed of the second holding unit 111 is then gradually increased. Also in this case, it is possible to prevent the contact between the devices and the supporting wafer S to suppress the damage to the devices.

Note that though the processing target wafer W and the supporting wafer S are separated from each other with the processing target wafer W arranged on the upper side and the supporting wafer S arranged on the lower side in the above embodiment, the upper and lower arrangement of the processing target wafer W and the supporting wafer S may be reversed.

Further, a heating device, for example, a heater to heat the inert gas to be supplied to the processing space 112 and the waiting space 218 may be provided in the separation apparatus 30. Alternatively, the inert gas to be supplied from the gas supply pipes 125, 191 may be heated in advance. In addition, the inert gas at substantially the same temperature (for example, 200° C.) as those of the first holding unit 110 and the second holding unit 111 may be supplied to the processing space 112 and the waiting space 218. With the above configuration, the softened state of the adhesive G can be maintained without cooling of the superposed wafer T by the inert gas. Further, the supply of the heated inert gas prevents the superposed wafer T from being partially cooled to partially contract, resulting in no damage to the electronic circuits on the processing target wafer W.

Figure 33:
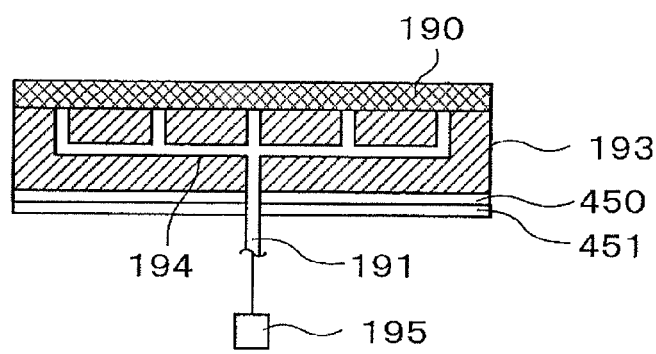
FIG. 33 A longitudinal sectional view illustrating the outline of a configuration of a heating device for the inert gas.

Note that as a concrete method of heating the inert gas, a heater 450 is provided at the lower surface of the distribution plate 193 in the porous plate 190 as illustrated in FIG. 33. The heater 450 is, for example, a film-shaped heater. A pressing plate 451 to press the heater 450 is disposed at the lower portion of the heater 450 so that the heater 450 is sandwiched between the distribution plate 193 and the pressing plate 451. Further, it is preferable to use materials whose expansion amounts at heating are substantially the same, for the porous plate 190, the distribution plate 193 and the pressing plate 451. All of them may be produced of, for example, the same material or may be produced of porous carbon that is a porous material and a metal, for example, titanium or the like, whose expansion amount is substantially the same as that of the porous carbon. Note that the heater is provided as the heating device also in the first holding unit 110, and the heater is the same as the above-described heater 450 and description thereof will be omitted.

Figure 34:
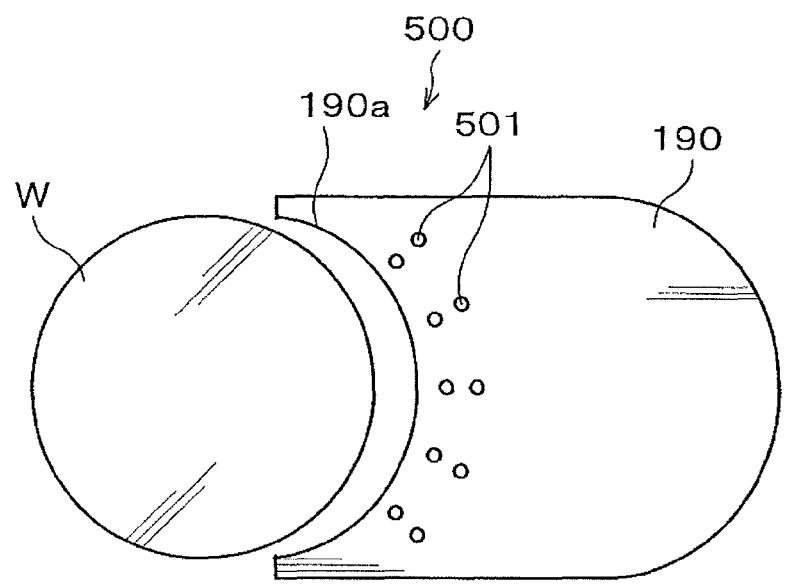
FIG. 34 A plan view for explaining a monitoring device for pore clogging of the porous plate.
Figure 35:
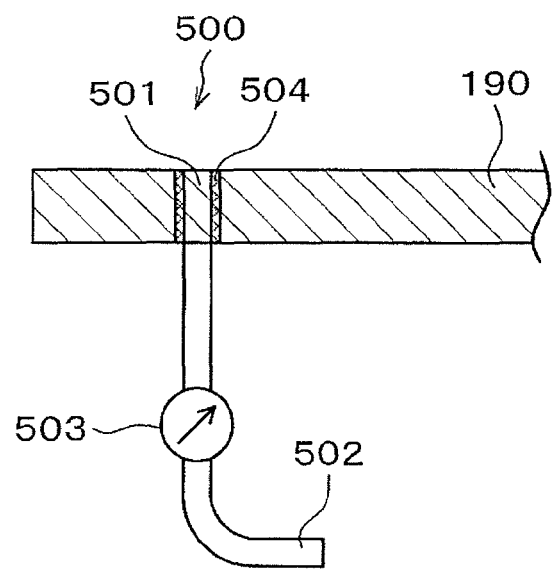
FIG. 35 A longitudinal sectional view for explaining the monitoring device for pore clogging of the porous plate.

Further, a monitoring device 500 to monitor pore clogging of the plurality of pores in the porous plate 190 may be provided as illustrated in FIG. 34 and FIG. 35. The monitoring device 500 is composed of a plurality of through holes 501 provided in the porous plate 190, pipes 502 each having one end connected to the through hole 501, and pressure gauges 503 each disposed in the middle of the pipe 502. Note that the other end of the pipe 502 is opened. The diameter of the through hole 501 is preferably small, and is set to, for example, 1 mm. The through holes 501 are provided at regular intervals on lines similar to the end portion of the hollow portion 190a and arranged in a plurality of rows. Note that an inner surface 504 of the through hole 501 is sealed by coating treatment.

Further, the pressure gauge 503 is provided for each of the plurality of through holes 501 to detect the pressure, and when the pressure becomes lower than a predetermined value, it is considered that pore clogging has occurred also in a portion of the porous plate 190 near the though hole 501, and warning is issued. Then, the separation processing is stopped and cleaning operation is performed. This can prevent pore clogging in the porous plate 190 and can evenly jet the inert gas from the porous plate 190 at all times.

Note that though the pressure difference with respect to the inside of the room is monitored by the pressure gauge 503 in the above embodiment, a suction pump (not illustrated) may be connected to the other end of the pipe 502 so that an absolute pressure is monitored by the pressure gauge 503.

Note that parts of the above embodiments may be combined and implemented, and the same operation and effect can be obtained.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention.

The present invention is not limited to the embodiments but can take various forms. The present invention is also applicable to the case where the substrate is a substrate other than the wafer, such as an FPD (Flat Panel Display), a mask reticle for a photomask or the like.

EXPLANATION OF CODES 1 separation system
30 separation apparatus
32 second transfer apparatus
110 first holding unit
111 second holding unit
112 processing space
121 porous
121a holding surface
122 groove part
124 suction pipe
125 gas supply pipe
128 heating mechanism
130 porous ring
151 heating mechanism
170 moving mechanism
190 porous plate
190a hollow portion
200 first cover
201 second cover
202 third cover
218 waiting space
220 opening
280 Bernoulli chuck
290 gas jetting port
300 control unit
400 ion gas supply pipe
401 ionizer
450 heater
500 monitoring device
G adhesive
S supporting wafer
T superposed wafer
W processing target wafer
$W_J$ joint surface
$W_N$ non-joint surface

What is claimed:

1. A separation apparatus for separating a superposed substrate in which a processing target substrate and a supporting substrate are joined together with an adhesive, into the processing target substrate and the supporting substrate, the separation apparatus comprising:

a first holding unit that includes a heating mechanism that heats the processing target substrate, and the first holding unit holds the processing target substrate;

a second holding unit that includes a heating mechanism that heats the supporting substrate, and the second holding unit holds the supporting substrate;

a moving mechanism that relatively moves at least the first holding unit or the second holding unit in a horizontal direction; and a porous plate of porous material, the porous plate having a flat plate shape, the flat plate shape is adapted to cover at least an entirety of the processing target substrate in a plan view, an entire surface of the porous plate adjacent the processing target substrate is formed with a plurality of pores, and the porous plate supplies, via the plurality of pores, an inert gas to a joint surface of the processing target substrate, the moving mechanism is controlled to relatively move, in the horizontal direction, the first holding unit and the second holding unit, to expose the joint surface of the processing target substrate.

2. The separation apparatus according to claim 1, wherein the porous plate is disposed to supply the inert gas horizontally from the plurality of pores.

3. The separation apparatus according to claim 1, wherein the porous plate is disposed to supply the inert gas obliquely upward from the plurality of pores.

4. The separation apparatus according to claim 1, wherein the first holding unit has a porous body of porous material, the porous body is formed with a plurality of pores, the first holding unit comes into contact with the processing target substrate to suction-hold the processing target substrate, and wherein a diameter of a holding surface of the porous body that holds the processing target substrate is smaller than a diameter of the processing target substrate.

5. The transfer apparatus according to claim 1, further comprising a suction pipe that sucks the processing target substrate to suction-hold the processing target substrate, and a gas supply pipe that supplies an inert gas to a space between the first holding unit and the second holding unit, the suction pipe and the gas supply pipe are connected to the first holding unit.

6. The separation apparatus according to claim 1, wherein, in a plan view, a concave portion is defined which is semicircular conforming to a periphery of the processing target substrate, the concave portion being formed at an end portion of the porous plate, the end portion being disposed in a moving direction of the porous plate.

7. The separation apparatus according to claim 1, wherein the moving mechanism moves, in the horizontal direction, the porous plate in synchronization with the second holding unit.

8. The separation apparatus according to claim 1, wherein the first holding unit and the second holding unit are provided with a first cover and a second cover respectively that are provided to cover a space between the first holding unit and the second holding unit, wherein the first cover is provided with a third cover provided in a manner to cover the porous plate, wherein end portions of the first cover and the second cover in a moving direction of the first holding unit or the second holding unit are opened, wherein an end portion of the third cover in a moving direction of the porous plate is opened, and wherein an atmosphere in a space surrounded by the first cover, the second cover, and the third cover is exhausted from an opening formed at the first cover and the second cover on a side opposite to the third cover.

9. The separation apparatus according to claim 8, wherein to the third cover, an ionized gas supply pipe to supply an inert gas ionized by an ionizer into the third cover is connected.

10. The separation apparatus according to claim 1, wherein the porous plate is provided with a heating device that heats the inert gas to be supplied from the porous plate.

11. The separation apparatus according to claim 1, further comprising a porous part of porous material, the porous part is annularly provided along an outer peripheral portion of the first holding unit, the porous part being formed with a plurality of pores, and the porous part further supplies the inert gas to the outer peripheral portion of the first holding unit that holds the processing target substrate.

12. A separation system comprising a separation apparatus for separating a superposed substrate in which a processing target substrate and a supporting substrate are joined together with an adhesive, into the processing target substrate and the supporting substrate, the separation apparatus which separates the processing target substrate and the supporting substrate, comprising:

a first holding unit that includes a heating mechanism that heats the processing target substrate, wherein the first holding unit holds the processing target substrate;

a second holding unit that includes a heating mechanism that heats the supporting substrate, wherein the second holding unit holds the supporting substrate;

a moving mechanism that relatively moves at least the first holding unit or the second holding unit in a horizontal direction; and a porous plate of porous material, the porous plate having a flat plate shape, the flat plate shape is adapted to cover at least an entirety of the processing target substrate in a plan view, an entire surface of the porous plate adjacent the processing target substrate is formed with a plurality of pores, and the porous plate supplies an inert gas to a joint surface of the processing target substrate, the moving mechanism is controlled to relatively move, in the horizontal direction, the first holding unit and the second holding unit, to expose the joint surface of the processing target substrate, the separation system comprising a transfer apparatus that transfers, from the separation apparatus, the processing target substrate separated by the separation apparatus, wherein the transfer apparatus has a Bernoulli chuck that jets an inert gas to hold the processing target substrate.

13. A separation method of separating a superposed substrate in which a processing target substrate and a supporting substrate are joined together with an adhesive, into the processing target substrate and the supporting substrate using a separation apparatus, the separation apparatus comprising:

a first holding unit that includes a heating mechanism heating the processing target substrate, wherein the first holding unit holds the processing target substrate;

a second holding unit that includes a heating mechanism heating the supporting substrate, wherein the second holding unit holds the supporting substrate;

a moving mechanism that relatively moves at least the first holding unit or the second holding unit in a horizontal direction; and a porous plate of porous material, the porous plate having a flat plate shape, the flat plate shape is adapted to cover at least an entirety of the processing target substrate in a plan view, an entire surface of the porous plate adjacent the processing target substrate is formed with a plurality of pores, and the porous plate supplies an inert gas to a joint surface of the processing target substrate exposed by relatively moving the first holding unit and the second holding unit in the horizontal direction by the moving mechanism, the separation method comprising:

relatively moving, by the moving mechanism, in the horizontal direction, the first holding unit and the second holding unit while heating the processing target substrate that is held by the first holding unit and the supporting substrate that is held by the second holding unit, to separate the processing target substrate and the supporting substrate from each other, wherein when the first holding unit holds the processing target substrate, the inert gas is supplied to the outer peripheral portion of the first holding unit from the porous plate, further comprising, when separating the processing target substrate and the supporting substrate from each other, controlling the porous plate to be distanced from the joint surface of the processing target substrate by a predetermined distance in a vertical direction so as to expose the joint surface of the processing target substrate, and supplying the inert gas from the porous plate to the joint surface of the processing target substrate exposed by the separation.

14. The separation method according to claim 13, wherein the first holding unit has a porous body of porous material, the porous body is formed with a plurality of pores and coming into contact with the processing target substrate, wherein the porous body suction-holds the processing target substrate, wherein a diameter of a holding surface of the porous body that suction-holds the processing target substrate is smaller than a diameter of the processing target substrate, and a groove part is a space defined by the porous body, the first holding unit and the processing target substrate, and wherein the inert gas from the porous body is supplied horizontally to the groove part.

15. The separation method according to claim 13, wherein the first holding unit has a porous body of porous material, the porous body is formed with a plurality of pores and coming into contact with the processing target substrate, wherein the porous body suction-holds the processing target substrate, wherein a diameter of a holding surface of the porous body that suction-holds the processing target substrate is smaller than a diameter of the processing target substrate, and a groove part is a space defined by the porous body, the first holding unit and the processing target substrate, and wherein the inert gas from the porous body is supplied obliquely upward to the groove part.

16. The separation method according to claim 13, wherein, a suction pipe and a gas supply pipe are connected to the first holding unit, the suction pipe sucks the processing target substrate to suction-hold the processing target substrate and the gas supply pipe supplies an inert gas to a space between the first holding unit and the second holding unit, and wherein, before the first holding unit suction-holds the processing target substrate, the inert gas is supplied from the gas supply pipe into the space.

17. The separation method according to claim 13, wherein, in a plan view, a concave portion is defined which is semicircular conforming to a periphery of the processing target substrate, the concave portion being formed at an end portion of the porous plate, the end portion being disposed in a moving direction of the porous plate, and wherein, at least before starting to separate the processing target substrate and the supporting substrate from each other, in the plan view, the porous plate is disposed in a manner that the hollow portion is in contact with the processing target substrate and supply of the inert gas from the porous plate is started.

18. The separation method according to claim 13, wherein the moving mechanism moves, in the horizontal direction, the porous plate in the in synchronization with the second holding unit.

19. The separation method according to claim 13, wherein the inert gas supplied from the porous plate has been heated.

20. The separation method according to claim 13, wherein the separation apparatus further comprises a porous part of porous material, the porous part is annularly provided along an outer peripheral portion of the first holding unit, the porous part being formed with a plurality of pores, further comprising supplying, by the porous part, the inert gas to the outer peripheral portion of the first holding unit that holds the processing target substrate.

21. A separation method of separating a superposed substrate in which a processing target substrate and a supporting substrate are joined together With an adhesive, into the processing target substrate and the supporting substrate using a separation apparatus, the separation apparatus comprising:

a first holding unit that includes a heating mechanism heating the processing target substrate, wherein the first holding unit holds the processing target substrate;

a second holding unit that includes a heating mechanism heating the supporting substrate, wherein the second holding unit holds the supporting substrate;

a moving mechanism that relatively moves at least the first holding unit or the second holding unit in a horizontal direction; and a porous plate of porous material, the porous plate having a flat plate shape, the flat plate shape is adapted to cover at least a part of the processing target substrate in a plan view, and the porous plate evenly supplies, via the porous material, an inert gas to a joint surface of the processing target substrate, the separation method comprising:

relatively moving, by the moving mechanism, in the horizontal direction, the first holding unit and the second holding unit while heating the processing target substrate that is held by the first holding unit and the supporting substrate that is held by the second holding unit, to separate the processing target substrate and the supporting substrate from each other, further comprising, when separating the processing target substrate and the supporting substrate from each other, evenly supplying the inert gas, via the porous material of the porous plate, to the joint surface of the processing target substrate exposed by the separation.

22. A separation apparatus for separating a superposed substrate in which a processing target substrate and a supporting substrate are joined together with an adhesive, into the processing target substrate and the supporting substrate, the separation apparatus comprising:
- a first holding unit that includes a heating mechanism that heats the processing target substrate, and the first holding unit holds the processing target substrate;
- a second holding unit that includes a heating mechanism that heats the supporting substrate, and the second holding unit holds the supporting substrate;
- a moving mechanism that relatively moves at least the first holding unit or the second holding unit in a horizontal direction; and
- a porous plate of porous material, the porous plate having a flat plate shape, the flat plate shape is adapted to cover at least a part of the processing target substrate in a plan view, and the porous plate supplies, via the porous material, an inert gas to a joint surface of the processing target substrate,
- the moving mechanism is controlled to relatively move, in the horizontal direction, the first holding unit and the second holding unit, to expose the joint surface of the processing target substrate.

23. The separation apparatus of claim 22, further comprising a distribution plate of metal, the distribution plate is disposed on a lower surface of the porous plate, the distribution plate comprises a plurality of gas flow passages, the gas supply passages of the distribution plate supply the inert gas evenly Within a plane of the porous plate.

24. A separation system comprising a separation apparatus for separating a superposed substrate in which a processing target substrate and a supporting substrate are joined together with an adhesive, into the processing target substrate and the supporting substrate,
- the separation apparatus which separates the processing target substrate and the supporting substrate, comprising:
    - a first holding unit that includes a heating mechanism that heats the processing target substrate, wherein the first holding unit holds the processing target substrate;
    - a second holding unit that includes a heating mechanism that heats the supporting substrate, wherein the second holding unit holds the supporting substrate;
    - a moving mechanism that relatively moves at least the first holding unit or the second holding unit in a horizontal direction; and
    - a porous plate of porous material, the porous plate having a flat plate shape, the flat plate shape is adapted to cover at least a part of the processing target substrate in a plan view, and the porous plate supplies, via the porous material, an inert gas to a joint surface of the processing target substrate,
    - the moving mechanism is controlled to relatively move, in the horizontal direction, the first holding unit and the second holding unit, to expose the joint surface of the processing target substrate,
- the separation system comprising a transfer apparatus that transfers, from the separation apparatus, the processing target substrate separated by the separation apparatus.

* * * * *